(12) United States Patent
Chadda et al.

(10) Patent No.: US 12,439,757 B2
(45) Date of Patent: Oct. 7, 2025

(54) SUBPIXEL LIGHT EMITTING DIODES FOR DIRECT VIEW DISPLAY AND METHODS OF MAKING THE SAME

(71) Applicant: SAMSUNG ELECTRONICS CO., LTD., Suwon-si (KR)

(72) Inventors: Saket Chadda, San Jose, CA (US); Anusha Pokhriyal, Sunnyvale, CA (US); Zulal Tezcan Ozel, Fremont, CA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/626,810

(22) Filed: Apr. 4, 2024

(65) Prior Publication Data

US 2024/0274772 A1    Aug. 15, 2024

Related U.S. Application Data

(62) Division of application No. 17/317,779, filed on May 11, 2021, now Pat. No. 11,973,172.
(Continued)

(51) Int. Cl.
*H10H 20/857* (2025.01)
*H10H 20/01* (2025.01)
(Continued)

(52) U.S. Cl.
CPC .......... *H10H 20/857* (2025.01); *H10H 20/01* (2025.01); *H10H 20/841* (2025.01);
(Continued)

(58) Field of Classification Search
CPC ..... H01L 33/62; H01L 27/156; H01L 33/005; H01L 33/46; H01L 2933/0025
See application file for complete search history.

(56) References Cited

U.S. PATENT DOCUMENTS 8,669,574 B2    3/2014    Konsek et al.
9,281,442 B2    3/2016    Romano et al.
(Continued)

FOREIGN PATENT DOCUMENTS

EP            3518283 A1    7/2019
KR    10-2017-0095914 A    8/2017
(Continued)

OTHER PUBLICATIONS

Communication issued Dec. 10, 2024 by the Japan Patent Office in Japanese Patent Application No. 2022-570399.
(Continued)

*Primary Examiner* — Ratisha Mehta
(74) *Attorney, Agent, or Firm* — Sughrue Mion, PLLC

(57) ABSTRACT

A method includes transferring a first subset of the first LEDs from a first substrate to a first backplane to form first subpixels in pixel regions, transferring a first subset of the second LEDs to a second backplane and separating the first subset of the second LEDs from a second substrate to leave first vacancies on the second substrate, forming an additional electrically conductive material on a second subset of second LEDs located on the second substrate after transferring the first subset of the second LEDs to the second backplane, positioning the second substrate over the first backplane, such that the first subpixels are disposed in the first vacancies, and transferring the second subset of the second LEDs to a second subset of bonding structures on the first backplane to form second subpixels in the pixel regions, while a gap exists between the first subpixels and the second substrate.

7 Claims, 29 Drawing Sheets

Related U.S. Application Data

(60) Provisional application No. 63/026,454, filed on May 18, 2020.

(51) Int. Cl.
*H10H 20/841* (2025.01)
*H10H 29/14* (2025.01)

(52) U.S. Cl.
CPC ......... *H10H 29/142* (2025.01); *H10H 20/034* (2025.01); *H10H 20/0364* (2025.01)

(56) References Cited

U.S. PATENT DOCUMENTS

| | | |
|---|---|---|
| 9,419,183 B2 | 8/2016 | Lowgren et al. |
| 9,444,007 B2 | 9/2016 | Kryliouk et al. |
| 10,177,123 B2 | 1/2019 | Gardner et al. |
| 10,193,038 B2 | 1/2019 | Farrens et al. |
| 10,236,447 B2 | 3/2019 | Danesh et al. |
| 10,304,810 B2 | 5/2019 | Gardner et al. |
| 10,522,520 B2 | 12/2019 | Liu et al. |
| 10,714,464 B2 | 7/2020 | Pokhriyal et al. |
| 2013/0026511 A1 | 1/2013 | Yeh et al. |
| 2017/0162552 A1* | 6/2017 | Thompson ........... H10D 10/056 |
| 2017/0236811 A1 | 8/2017 | Pokhriyal et al. |
| 2017/0288102 A1 | 10/2017 | Farrens et al. |
| 2017/0346011 A1 | 11/2017 | Danesh et al. |
| 2017/0373046 A1 | 12/2017 | Gardner et al. |
| 2018/0166429 A1 | 6/2018 | Chong et al. |
| 2018/0366450 A1 | 12/2018 | Gardner et al. |
| 2019/0088820 A1 | 3/2019 | Danesh et al. |
| 2019/0131282 A1 | 5/2019 | Lu et al. |
| 2019/0326478 A1 | 10/2019 | Danesh et al. |
| 2019/0333898 A1 | 10/2019 | Plobl et al. |
| 2019/0371229 A1 | 12/2019 | Wang et al. |
| 2020/0013760 A1 | 1/2020 | Lin et al. |
| 2020/0105980 A1* | 4/2020 | Sim ....................... A61K 40/405 |
| 2020/0127168 A1 | 4/2020 | Danesh et al. |
| 2020/0357972 A1* | 11/2020 | Lutgen ............... H10D 30/0295 |
| 2021/0359186 A1 | 11/2021 | Chadda et al. |

FOREIGN PATENT DOCUMENTS

| | | |
|---|---|---|
| KR | 10-2000-0002733 A | 1/2020 |
| TW | 1635605 B | 9/2018 |
| TW | 201840015 A | 11/2018 |
| WO | 2016/100657 A2 | 6/2016 |
| WO | WO2018-223391 A | 12/2018 |
| WO | WO2019147589 A1 | 8/2019 |

OTHER PUBLICATIONS

ISR-WO—Notification of Transmittal of the International Search Report and the Written Opinion of the International Searching Authority for International Patent Application No. PCTUS2021/031868, mailed on Aug. 30, 2021, 12 pages.

IPRP—Notification of Transmittal of International Preliminary Report on Patentability and Written Opinion of the International Searching Authority for International Patent Application No. PCT/US2021/031868, mailed Dec. 1, 2022, 7 pages.

European Patent Office Communication and Search Report for European Patent Application No. 21808976.1, mailed on May 13, 2024, 6 pages.

Communication dated Jan. 7, 2025, issued by the Taiwan Intellectual Property Office in Taiwanese Application No. 110116921.

Office Action dated Jul. 15, 2025, issued by Korean Patent Office in Korean Patent Application No. 10-2022-7044261.

Communication dated Aug. 5, 2025 issued by the China National Intellectual Property Administration in Chinese Patent Application No. 202180048362.6.

* cited by examiner

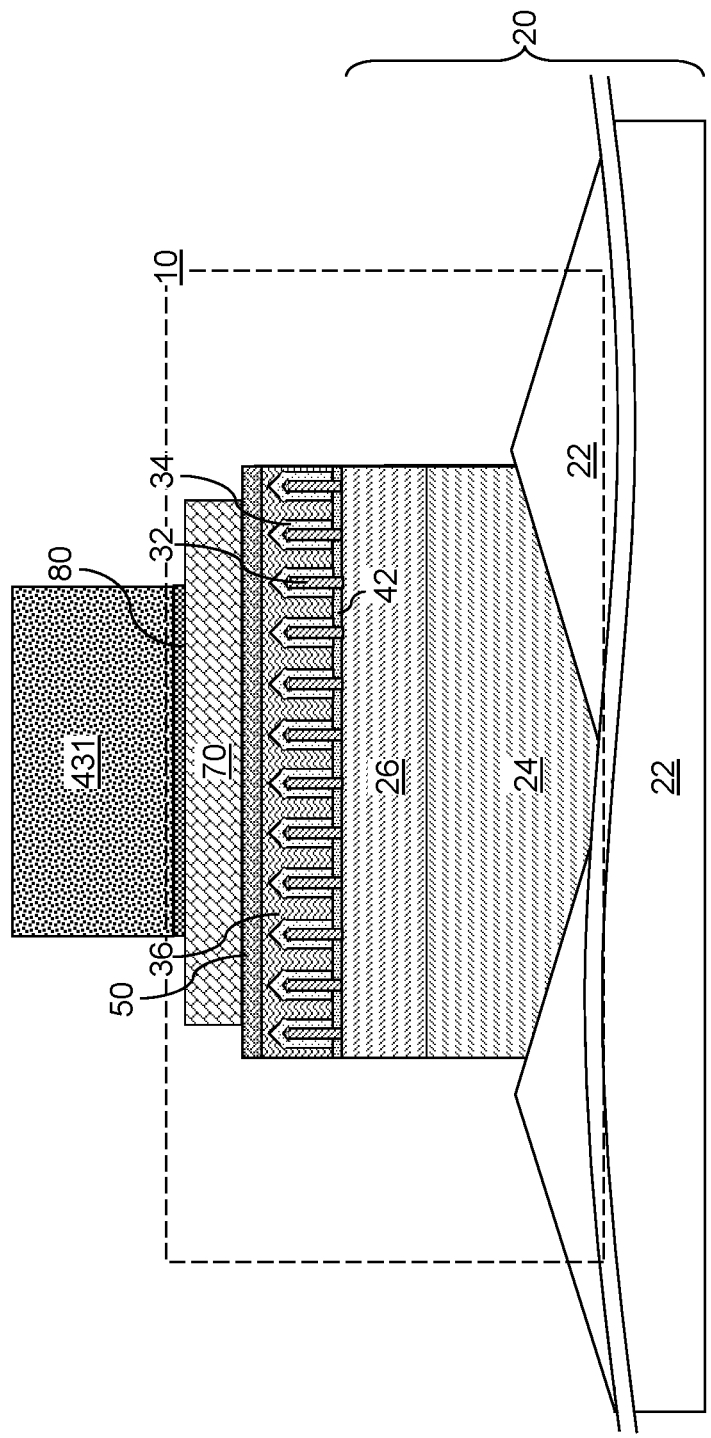

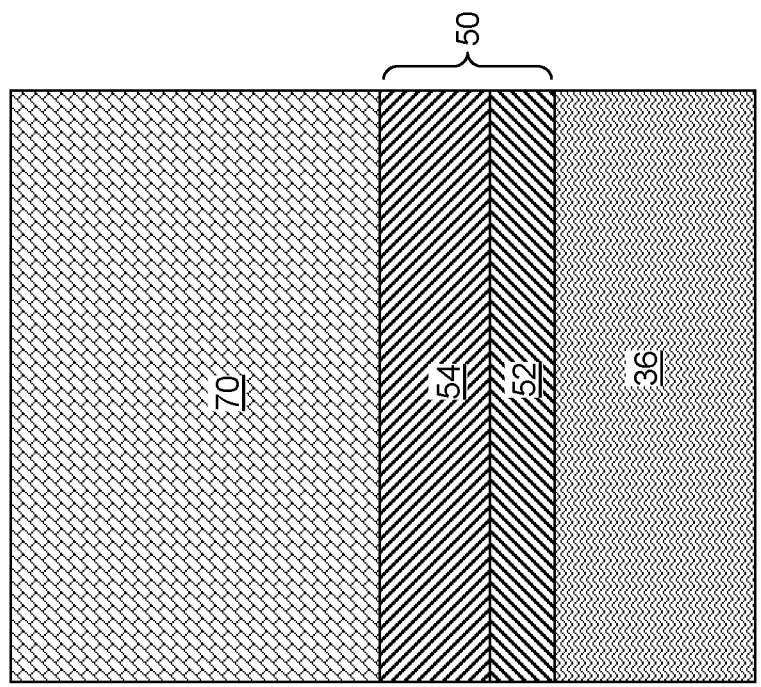
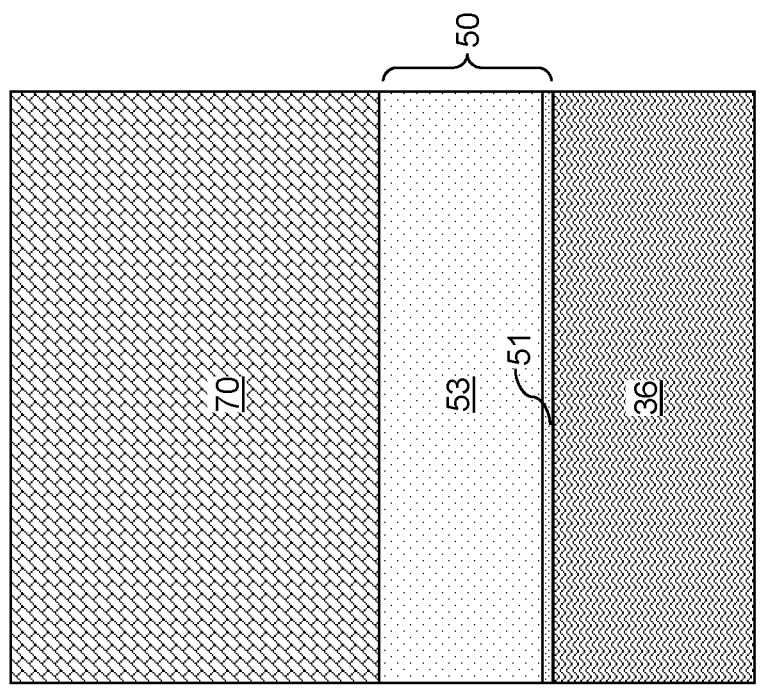
FIG. 5B
FIG. 5A

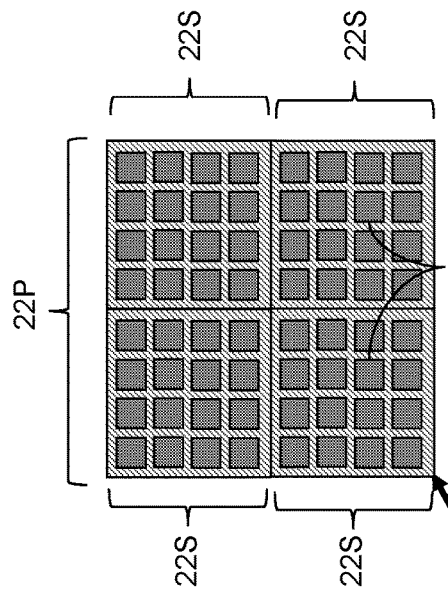
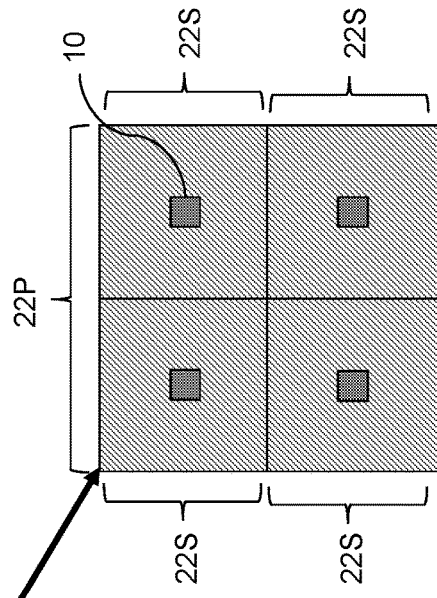
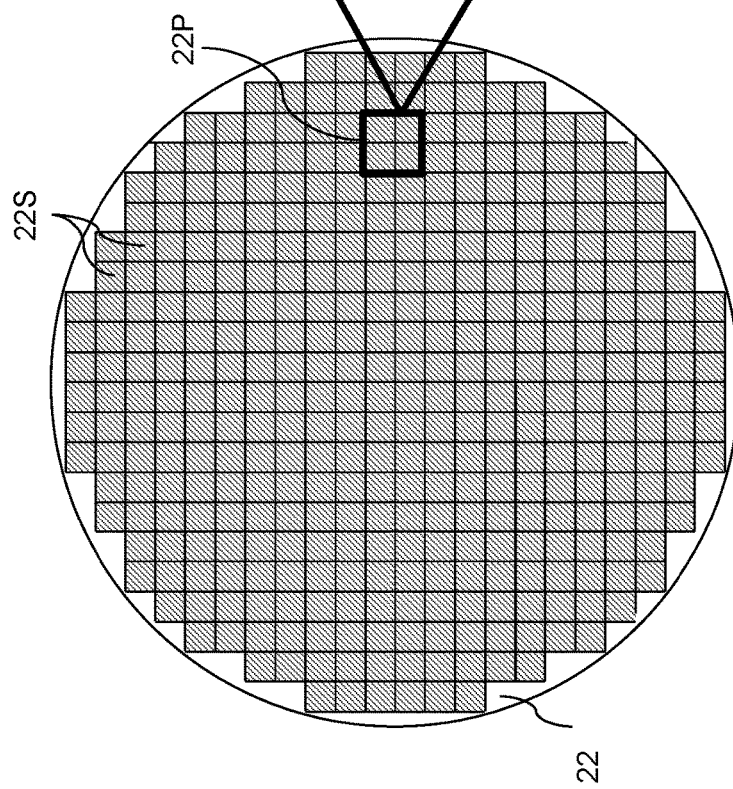

SUBPIXEL LIGHT EMITTING DIODES FOR DIRECT VIEW DISPLAY AND METHODS OF MAKING THE SAME

FIELD

The present invention relates to light emitting devices, and particularly to subpixel light emitting diodes for direct view display devices and methods of fabricating the same.

BACKGROUND

Light emitting devices such as light emitting diodes (LEDs) are used in electronic displays, such as backlights in liquid crystal displays located in laptops or televisions. Light emitting devices include light emitting diodes and various other types of electronic devices configured to emit light.

SUMMARY

Various embodiments provide a display device which comprises a backplane, a first light emitting diode (LED) containing a first reflector and configured to emit first color light bonded to the backplane, a second LED containing a second reflector and configured to emit second color light different from the first color light bonded to the backplane, and a third LED containing a third reflector and configured to emit third color light different from the first and second color light bonded to the backplane. The second reflector is thicker than the first reflector, and the third reflector is thicker than the second reflector.

Various embodiments provide a method of transferring light emitting diodes (LEDs) which comprises providing first LEDs configured to emit first color light and located on a first substrate, and second LEDs configured to emit second color light different from the first color light and located on a second substrate, transferring a first subset of the first LEDs to a first subset of bonding structures on a first backplane to form first subpixels in pixel regions and separating the first subset of the first LEDs from the first substrate, transferring a first subset of the second LEDs to a second backplane and separating the first subset of the second LEDs from the second substrate to leave first vacancies on the second substrate, forming an additional electrically conductive material on a second subset of second LEDs located on the second substrate after transferring the first subset of the second LEDs to the second backplane, positioning the second substrate over the first backplane, such that the first subpixels are disposed in the first vacancies, and transferring the second subset of the second LEDs to a second subset of bonding structures on the first backplane to form second subpixels in the pixel regions, while a gap exists between the first subpixels and the second substrate due to the presence of the additional electrically conductive material.

BRIEF DESCRIPTION OF THE DRAWINGS

FIG. 3A is a vertical cross-sectional view of a fifth configuration of a light emitting diode according to various embodiments of the present disclosure.

FIG. 5A illustrates of a first configuration of an anode contact according to various embodiments of the present disclosure.

FIG. 5B illustrates of a second configuration of an anode contact according to various embodiments of the present disclosure.

FIGS. 11A-11C are top views of a semiconductor wafer according to various embodiments of the present disclosure.

DETAILED DESCRIPTION

Figure 1A:
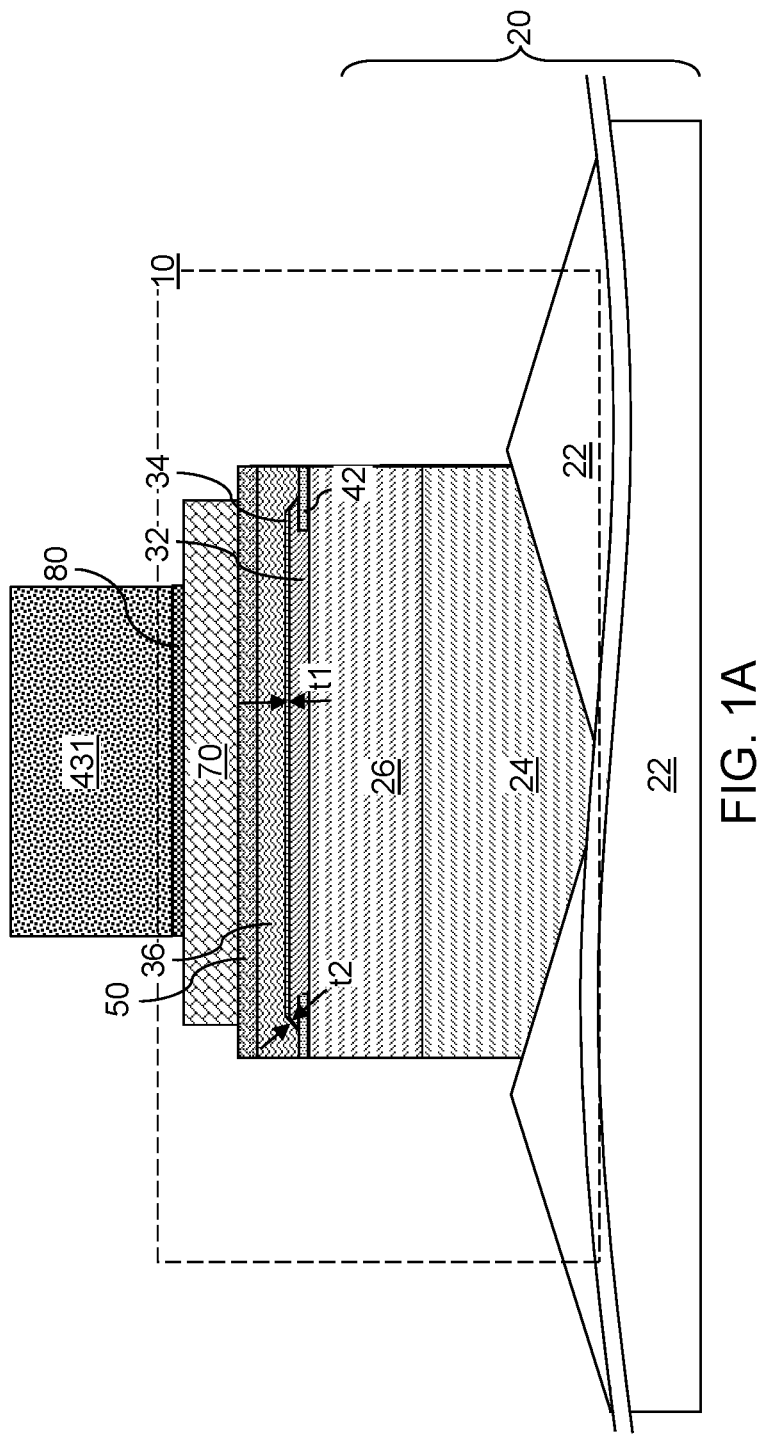
FIG. 1A is a vertical cross-sectional view of a first configuration of a light emitting diode according to various embodiments of the present disclosure.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being disposed "on" or "connected to" another element or layer, it can be directly on or directly connected to the other element or layer, or intervening elements or layers may be present. In contrast, when an element is referred to as being disposed "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ). Herein, the terms "about" and "substantially" may refer to a variance of +/−5%, such as +/−1%.

A display device, such as a direct view display device, can be formed from an ordered array of pixels bonded to a backplane. Each pixel can include a set of subpixels that emit light at a respective peak wavelength. For example, a pixel can include a red subpixel, a green subpixel, and a blue subpixel. Each subpixel can include one or more light emitting diodes (LEDs) that emit light of a particular wavelength. Each pixel is driven by a backplane circuit such that any combination of colors within a color gamut may be shown on the display for each pixel. The display panel can be formed by a process in which LED subpixels are soldered to, or otherwise electrically attached to, a bond pad located on the backplane. The bond pad is electrically driven by the backplane circuit and other driving electronics.

FIGS. 1A, 1B, 2A, 2B, 3A, 3B, 4A, 4B, and 4C illustrate various configurations of light emitting diodes 10 of the present disclosure. The various configurations of the light emitting devices of the present disclosure can be generally formed by providing a support substrate 22 and a single crystalline buffer semiconductor layer 24. The support substrate 22 can include a single crystalline material such as $Al_2O_3$ (sapphire) using either basal plane or r-plane growing surfaces, diamond, Si, Ge, GaN, AlN, SiC in both wurtzite ($\alpha$) and zincblende ($\beta$) forms, InN, GaP, GaAsP, GaAs, InP, ZnO, ZnS, and ZnSe. For example, the support substrate 22 can include sapphire (i.e., single crystalline aluminum oxide) with a suitable surface orientation. The support substrate 22 may comprise a patterned sapphire substrate (PSS) having a patterned (e.g., rough) growth surface. Bumps, dimples, and/or angled cuts may, or may not, be provided on the top surface of the support substrate 22 to facilitate epitaxial growth of the single crystalline compound semiconductor material of the buffer layer, to facilitate separation of the single crystalline buffer semiconductor layer 24 from the support substrate 22 in a subsequent separation process. If bumps and/or dimples are provided on the top surface of the support substrate 22, the lateral dimensions of each bump or each dimple can be in a range from 1.5 micron to 6 micron although lesser and greater lateral dimensions can also be employed. The center-to-center distance between neighboring pairs of bumps or dimples can be in a range from 3 microns to 15 microns, although lesser and greater distances can also be employed. Various geometrical configurations can be employed for arrangement of the bumps or dimples. The height of the bumps and/or the depth of the dimples may be in on the order of 1 microns to 3 microns, although lesser and greater heights and/or depths can also be employed.

The single crystalline buffer semiconductor layer 24 includes a single crystalline compound semiconductor material such as a III-V compound semiconductor material, for example a Group III-nitride compound semiconductor material. The deposition process for forming the single crystalline buffer semiconductor layer 24 can employ any of metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), and atomic layer deposition (ALD). The single crystalline buffer semiconductor layer 24 can have a constant or a graded composition such that the composition of the single crystalline buffer semiconductor layer 24 at the interface with the support substrate 22 provides a substantial lattice matching with the two-dimensional lattice structure of the top surface of the support substrate 22. The composition of the single crystalline buffer semiconductor layer 24 can be gradually changed during the deposition process. If the support substrate 22 includes patterned sapphire, then the bottom surface of the single crystalline buffer semiconductor layer 24 may be a patterned (i.e., rough) surface.

The materials that can be employed for a bottom portion of the single crystalline buffer semiconductor layer 24 can be, for example, $Ga_{1-w-x}In_wAl_xN$ in which w and x range between zero and less than one, and can be zero (i.e., GaN) and are selected to match the lattice constant of the top surface of the support substrate 22. Optionally, As and/or P may also be included in the material for the bottom portion of the buffer layer, in which case the bottom portion of the single crystalline buffer semiconductor layer 24 can include $Ga_{1-w-x}In_wAl_xN_{1-x-z}As_yP_z$ in which y and z between zero and less than one, that matches the lattice constant of the top surface of the support substrate 22. The materials that can be employed for an top portion of the single crystalline buffer semiconductor layer 24 include, but are not limited to, III-V compound materials, including III-nitride materials, such as gallium nitride (GaN), aluminum nitride (AlN), indium nitride (InN), gallium aluminum nitride, and gallium indium nitride, as well as other III-V materials, such as gallium phosphide (GaP), gallium arsenide (GaAs), gallium antimonide (GaSb), Indium phosphide (InP), indium arsenide (InAs), and indium antimonide (InSb). The composition of the single crystalline buffer semiconductor layer 24 can gradually change between the bottom portion of the single crystalline buffer semiconductor layer 24 and the top portion of single crystalline buffer semiconductor layer 24 such that dislocations caused by a gradual lattice parameter change along the growth direction (vertical direction) does not propagate to the top surface of the single crystalline buffer semiconductor layer 24. In one embodiment, a thin bottom portion of the single crystalline buffer semiconductor layer 24 less than 1 micron in thickness may be undoped or doped at a low concentration of silicon.

A high quality single crystalline surface with low defect density can be provided at the top surface of the single crystalline buffer semiconductor layer 24. Optionally, the top surface of the single crystalline buffer semiconductor layer 24 may be planarized to provide a planar top surface, for example, by chemical mechanical planarization. A suitable surface clean process can be performed after the planarization process to remove contaminants from the top surface of the single crystalline buffer semiconductor layer 24. The average thickness of the single crystalline buffer semiconductor layer 24 may be in a range from 2 microns to 10 microns, although lesser and greater thicknesses can also be employed.

An n-doped compound semiconductor substrate layer 26 is subsequently formed directly on the top surface of the single crystalline buffer semiconductor layer 24. The n-doped compound semiconductor substrate layer 26 can be formed as a continuous material layer having a uniform thickness over the entire top surface of the single crystalline buffer semiconductor layer 24. The n-doped compound semiconductor substrate layer 26 includes an n-doped compound semiconductor material. The n-doped compound semiconductor substrate layer 26 can be lattice matched with the single crystalline compound semiconductor material of the top portion of the single crystalline buffer semiconductor layer 24. The n-doped compound semiconductor substrate layer 26 may, or may not, include the same compound semiconductor material as the top portion of the single crystalline buffer semiconductor layer 24. In one embodiment, the n-doped compound semiconductor substrate layer 26 can include an n-doped direct band gap compound semiconductor material. In one embodiment, the n-doped compound semiconductor substrate layer 26 can include n-doped gallium nitride (GaN), indium gallium nitride (InGaN) or other III-V semiconductor materials, such as gallium phosphide or its ternary or quarternary compounds. The deposition process for forming the n-doped compound semiconductor substrate layer 26 can employ any of metalorganic vapor phase epitaxy (MOVPE), molecular beam epitaxy (MBE), hydride vapor phase epitaxy (HYPE), liquid phase epitaxy (LPE), metal-organic molecular beam epitaxy (MOMBE), and atomic layer deposition (ALD). The thickness of the n-doped compound semiconductor substrate layer 26 can be in a range from 300 nm to 2 microns, although lesser and greater thicknesses can also be employed. The support substrate 22, the single crystalline buffer semiconductor layer 24, and the n-doped compound semiconductor substrate layer 26 collectively comprise a substrate 20.

In some embodiments (such as the embodiments illustrated in FIGS. 1A, 1B, 2A, 2B, 3A, and 3B), a patterned growth mask layer 42 can be formed on the top surface of the substrate 20 (e.g., on top of the n-doped compound semiconductor substrate layer 26). The patterned growth mask layer 42 can be formed, for example, by depositing a dielectric material layer and patterning the dielectric material layer to form openings therein. For example, a silicon nitride layer, a silicon oxide layer, or a dielectric metal oxide layer (such as an aluminum oxide layer) can be formed on the top surface of the substrate 20. In one embodiment, the dielectric material layer can include a silicon nitride layer. The thickness of the dielectric material layer can be in a range from 3 nm to 100 nm, although lesser and greater thicknesses can also be employed.

A photoresist layer (not shown) can be applied over the top surface of the dielectric material layer, and can be lithographically patterned to form openings therethrough by lithographic exposure and development. In one embodiment, the openings in the photoresist layer can be formed as a two-dimensional periodic array. The size and shape of each opening can be selected to optimize the shape and size of semiconductor structures to be subsequently formed by a selective deposition process (such as a selective epitaxy process). The pattern of the openings in the photoresist layer can be transferred through the dielectric material layer to form the patterned growth mask layer 42. The photoresist layer can be subsequently removed, for example, by ashing. Alternatively, the growth mask layer can be patterned using electron beam lithography or nano-imprint lithography followed by etching. The patterned growth mask layer 42 includes openings, which may, or may not, be arranged as a two-dimensional periodic array. The shape of each opening may be circular, elliptical, or polygonal (such as hexagonal). A portion of the top surface of the n-doped compound semiconductor substrate layer 26 is physically exposed underneath each opening through the patterned growth mask layer 42.

The single crystalline buffer semiconductor layer 24, the n-doped compound semiconductor substrate layer 26, and additional structures to be formed thereupon will be subsequently patterned to define an array of subpixels, which is an array of light emitting diodes 10. Thus, each subsequently patterned area of the single crystalline buffer semiconductor layer 24 and the n-doped compound semiconductor substrate layer 26 will correspond to the area of a respective light emitting diode 10. For example, the array of light emitting diodes 10 may be formed as a rectangular array or a hexagonal array, and each light emitting diode 10 may be formed with a maximum lateral dimension (such as the diagonal of a rectangular shape or the diameter of a circumscribing circle of a hexagonal shape) in a range from 1 micron to 60 microns, such as from 2 micron to 30 microns. For example, the maximum lateral dimension of each opening through the patterned growth mask layer 42 may be in a range from 50 nm to 50 microns (such as from 200 nm to 10 microns), although lesser and greater dimensions may also be employed.

In an alternative embodiment, the single crystalline buffer semiconductor layer 24 and the n-doped compound semiconductor substrate layer 26 are patterned by a combination of a lithographic process and an anisotropic etch prior to formation of the additional structures (e.g., epitaxial growth of subsequent semiconductor materials) on the n-doped compound semiconductor substrate layer 26. For example, a photoresist layer can be applied over the n-doped compound semiconductor substrate layer 26, and is lithographically patterned to cover each discrete area of light emitting diodes 10. For example, two sets of line trenches extending along orthogonal horizontal directions can be formed through the n-doped compound semiconductor substrate layer 26 and the single crystalline buffer semiconductor layer 24 to form a rectangular array of patterned portions of the n-doped compound semiconductor substrate layer 26 and the single crystalline buffer semiconductor layer 24. The photoresist layer can be subsequently removed.

Figure 1B:
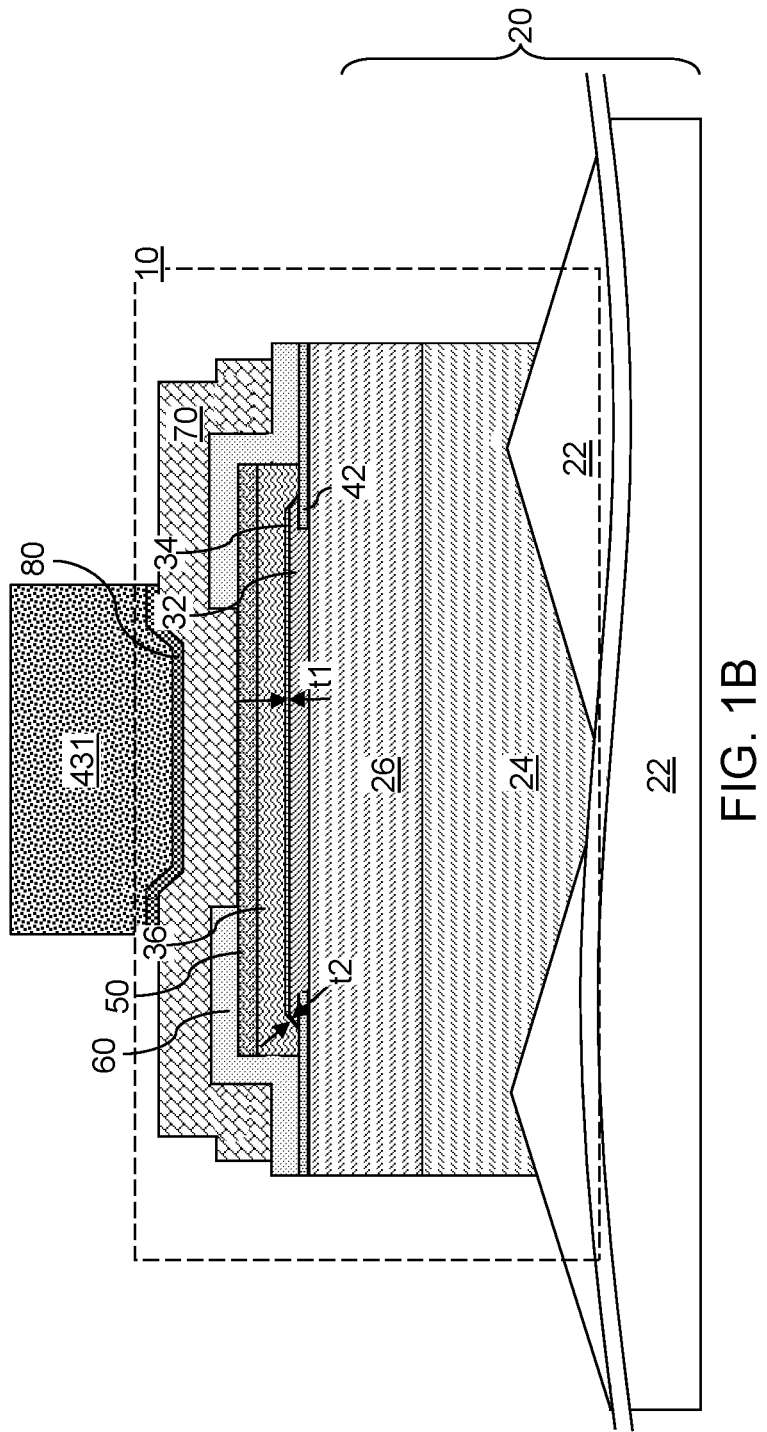
FIG. 1B is a vertical cross-sectional view of a second configuration of a light emitting diode according to various embodiments of the present disclosure.
Figure 2A:
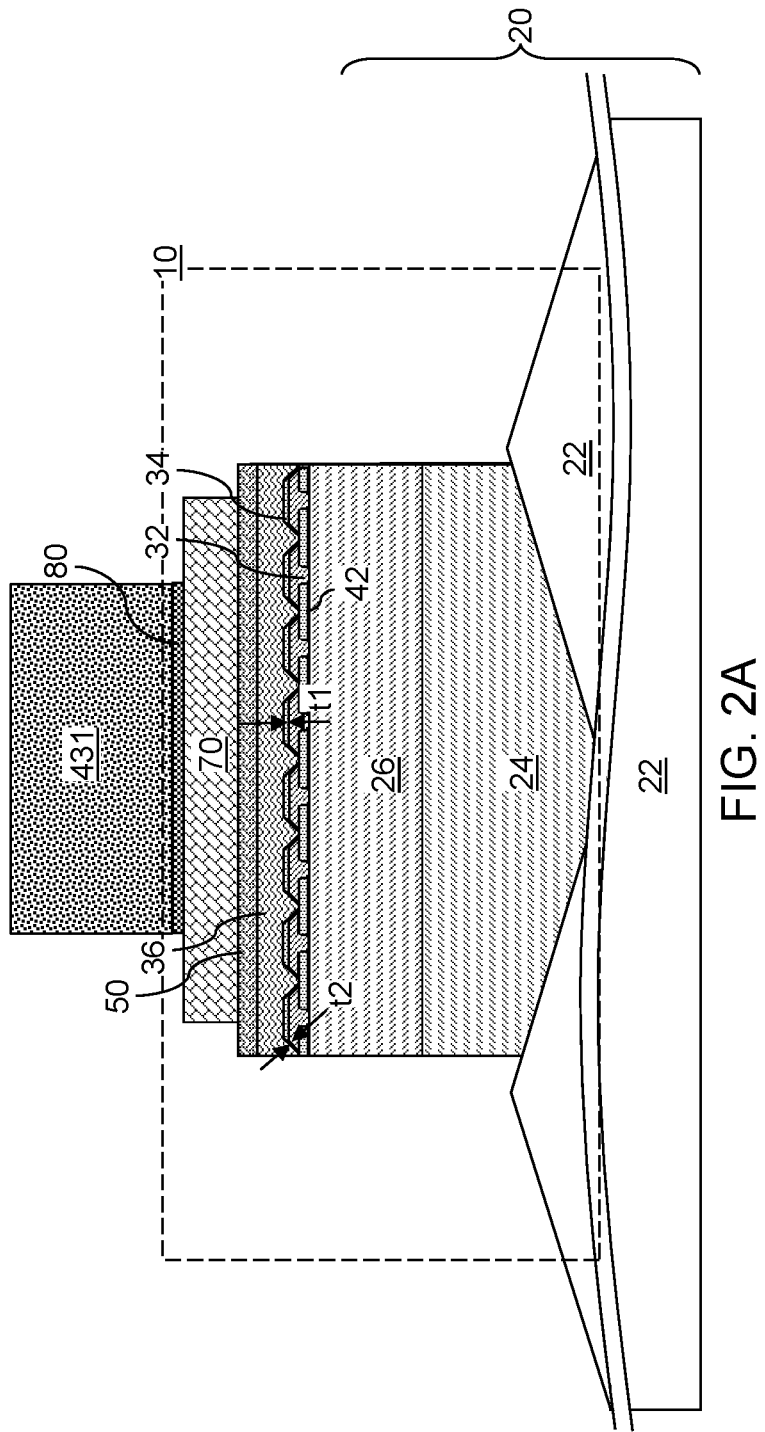
FIG. 2A is a vertical cross-sectional view of a third configuration of a light emitting diode according to various embodiments of the present disclosure.
Figure 2B:
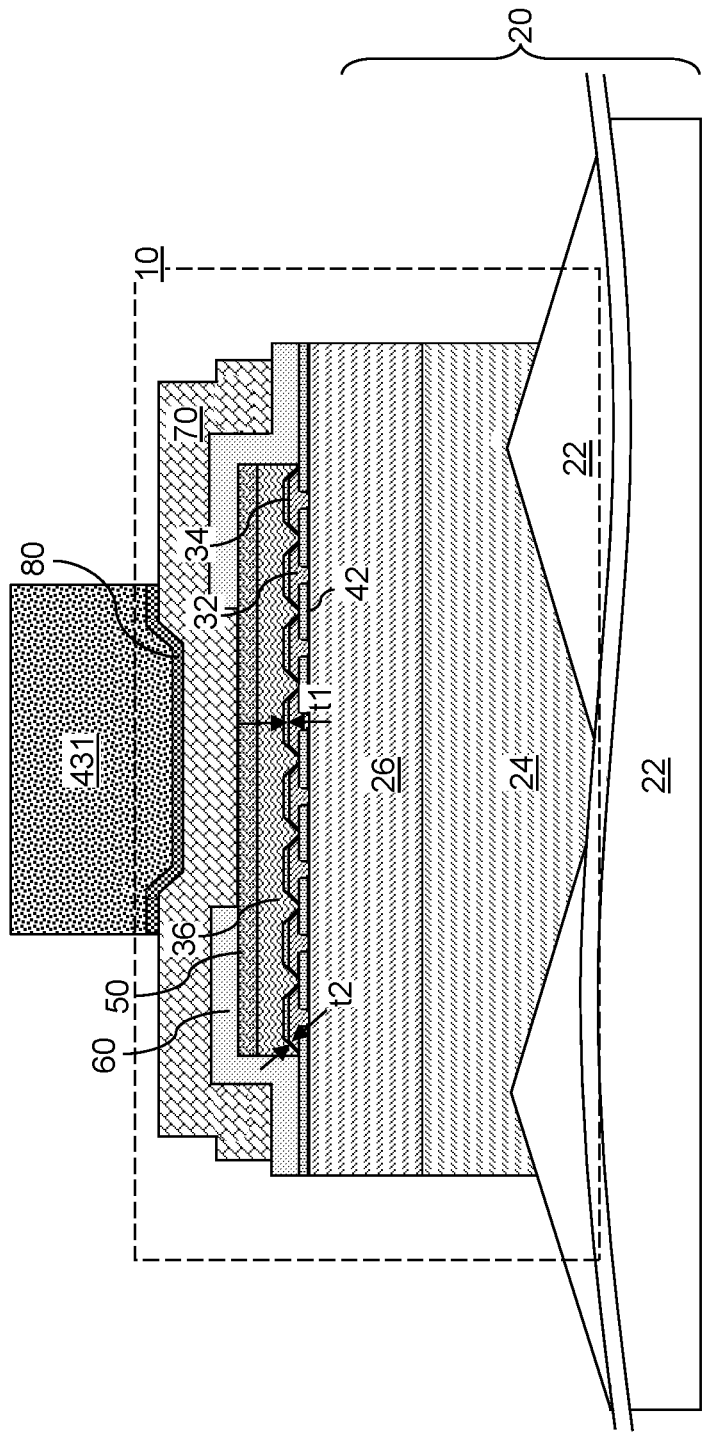
FIG. 2B is a vertical cross-sectional view of a fourth configuration of a light emitting diode according to various embodiments of the present disclosure.
Figure 3B:
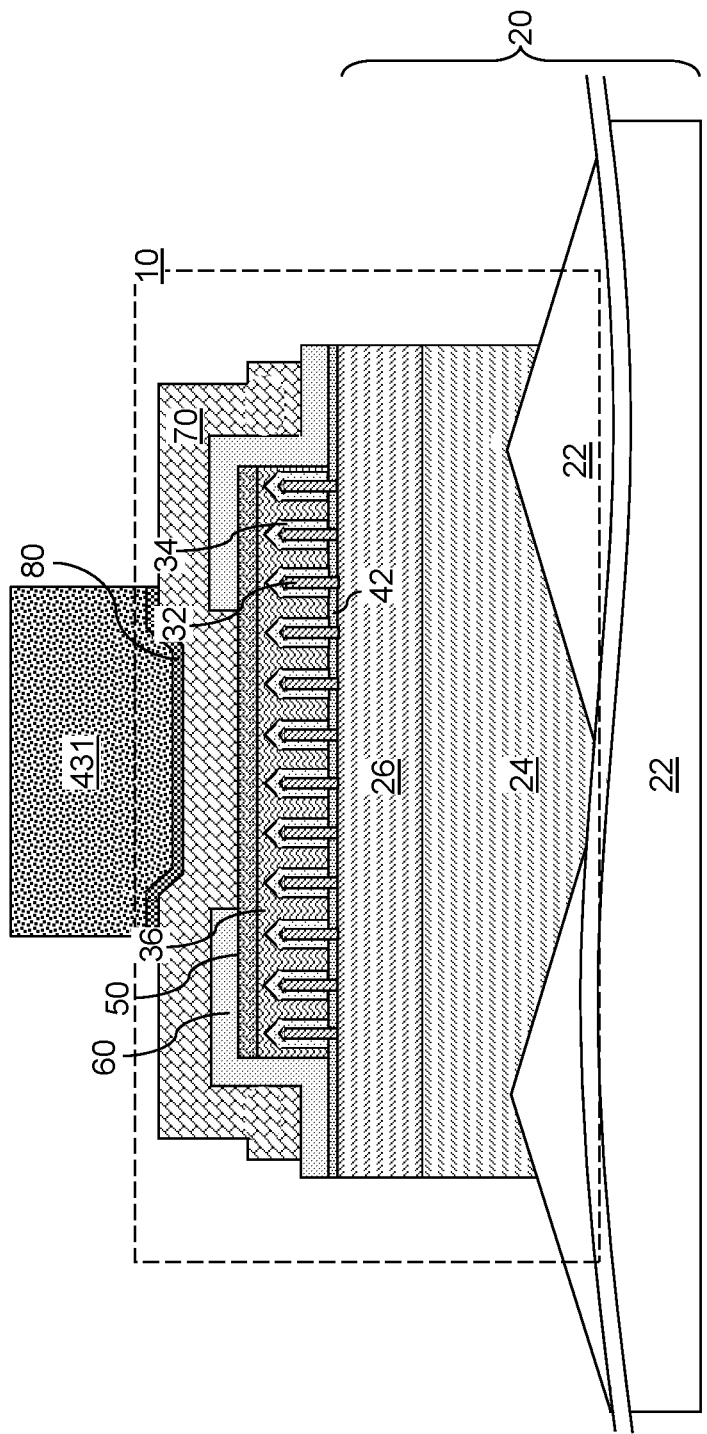
FIG. 3B is a vertical cross-sectional view of a sixth configuration of a light emitting diode according to various embodiments of the present disclosure.

In configurations such as the configurations of FIGS. 1A and 1B, each area for a light emitting diode 10 includes a respective single opening in the patterned growth mask layer 42. In configurations such as the configurations of FIGS. 2A, 2B, 3A, and 3B, each area for a light emitting diode 10 includes a respective array of openings in the patterned growth mask layer 42.

In some other embodiments (such as the embodiments illustrated in FIGS. 4A-4C), the patterned growth mask layer 42 is not employed. In this case, continuous planar semiconductor layers are formed on the n-doped compound semiconductor substrate layer 26.

N-doped compound semiconductor regions 32 can be grown through, and over, the growth mask layer 42 by a selective compound semiconductor deposition process, which can be a selective epitaxy process. The shapes and sizes of the n-doped compound semiconductor regions 32 can be determined based on the shapes and dimensions of the openings through the growth mask layer 42 and by the process conditions of the selective compound semiconductor deposition process. The n-doped compound semiconductor regions 32 can be formed with various crystallographic facets located within a respective crystallographic plane. As used herein, a "p-plane" means a "pyramid plane," which can by any of the $\{1\bar{1}01\}$ planes in the III-nitride system, a "c-plane" represents a $\{0001\}$ plane, and an "m-plane" represents any of the $\{1\bar{1}00\}$ planes. Growth rates generally differ among the different crystallographic planes. A "growth rate" herein means a layer growth rate along the direction perpendicular to a growth surface when not otherwise specified. In one embodiment, the top surface of the n-doped compound semiconductor substrate layer 26 can be within a c-plane. The height of each n-doped compound semiconductor region 32 can be in a range from 50 nm to 10 microns, such as from 200 nm to 2 microns, although lesser and greater heights can also be employed. In some embodiments, an anneal at an elevated temperature that induces migration of deposited semiconductor materials, a partial etch back process, and/or chemical mechanical planarization process may be optionally employed to provide planar top surfaces and/or faceted surfaces.

In some embodiments (such as the embodiments illustrated in FIGS. 1A and 1B), the n-doped compound semiconductor regions 32 can be formed as microdiscs. As used herein, a disc refers to a structural element having a top surface and a bottom surface that are parallel to each other and the area of the top surface is greater than the total area of surfaces (such as faceted surfaces or sidewall surfaces) that are not parallel to the top surface. A "microdisc" refers to a disc for which the maximum lateral dimension of the top surface is at least 1 micron and is less than 1 mm A microdisc may have a circular, oval or polygonal (e.g., rectangular, hexagonal, etc.) when viewed from above.

In some embodiments (such as the embodiments illustrated in FIGS. 2A and 2B), the n-doped compound semiconductor regions 32 can be formed as nanodiscs. A "nanodisc" refers to a disc for which the maximum lateral dimension of the top surface is at least 1 nm and less than 1 micron. A cluster of microdiscs or nanodiscs can be formed for each area of a light emitting diode 10.

In some embodiments (such as the embodiments illustrated in FIGS. 3A and 3B), the n-doped compound semiconductor regions 32 can be formed as nanowire cores, microwire cores, nanopyramids, micropyramids, nanofrustums, microfrustums, combinations thereof, or other nanoscale structures or microscale structures. A "nanowire" refers to a structure extending along a lengthwise direction (such as a vertical direction) and having a maximum vertical dimension that is greater than a maximum lateral dimension that is at least than 1 nm and less than 1 micron, and including a region of a substantially uniform cross-sectional shape along the direction perpendicular to the lengthwise direction. A "microwire" refers to a structure extending along a lengthwise direction (such as a vertical direction) and having a maximum vertical dimension that is greater than a maximum lateral dimension that is at least 1 micron and less than 1 mm, and including a region of a substantially uniform cross-sectional shape along the direction perpendicular to the lengthwise direction. A "nanopyramid" refers to a conical structure having a base of a polygonal or otherwise generally curvilinear shape such that the maximum lateral dimension of the base is at least than 1 nm and less than 1 micron. A "micropyramid" refers to a conical structure having a base of a polygonal or otherwise generally curvilinear shape such that the maximum lateral dimension of the base is at least than 1 micron and less than 1 mm A "nanofrustum" refers to a frustum (i.e., a conical structure without a region around an apex) having a base of a polygonal or otherwise generally curvilinear shape such that the maximum lateral dimension of the base is at least than 1 nm and less than 1 micron. A "microfrustum" refers to a frustum having a base of a polygonal or otherwise generally curvilinear shape such that the maximum lateral dimension of the base is at least than 1 micron and less than 1 mm. If the top surface of the n-doped compound semiconductor substrate layer 26 is within a c-plane, the nanowires and the microwires may include m-planes, p-planes, and optionally a respective c-plane. The nanopyramids, the micropyramids, the nanofrustums, and the microfrustums may include p-planes. The nanofrustums and the microfrustums may include c-planes.

Selective epitaxy processes that may be employed to form the n-doped compound semiconductor regions 32 are described, for example, in U.S. Pat. No. 9,444,007 to Kryliouk et al., U.S. Pat. No. 9,419,183 to Lowgren et al., U.S. Pat. No. 9,281,442 to Romano et al., and U.S. Pat. No. 8,669,574 to Konsek et al., each of which is assigned to Glo AB and is incorporated herein by reference in their entirety.

In some embodiments (such as the embodiments illustrated in FIGS. 4A-4C), the epitaxy of the n-doped compound semiconductor region 32 may be performed without employing a patterned growth mask 42 on all physically exposed surfaces of an array of patterned portions of the n-doped compound semiconductor substrate layer 26. In this embodiment, n-doped compound semiconductor region 32 comprises a continuous planar semiconductor layer.

Subsequently, an active region 34 including an optically active compound semiconductor layer stack configured to emit light is formed on each n-doped compound semiconductor region 32. Each active region 34 includes at least one semiconductor material that emits light upon application of a suitable electrical bias. For example, each active region 34 can include a single or a multi-quantum well (MQW) structure that emits light upon application of an electrical bias thereacross. For example, the quantum well(s) may comprise indium gallium nitride well(s) located between gallium nitride or aluminum gallium nitride barrier layers. Alternatively, the active regions 34 can include any other suitable semiconductor layers (e.g., such as gallium phosphide or its ternary or quarternary compounds) or stack of layers for light emitting diode applications provided that it can be grown on the surfaces of the n-doped compound semiconductor regions 32. The set of all layers within an active region 34 is herein referred to as an active layer.

In one embodiment, each of the plurality of active regions 34 includes a respective optically active compound semiconductor layer stack configured to emit light. In a non-limiting illustrative example, the active region 34 can include a layer stack including, from bottom to top, a silicon-doped GaN layer having a thickness of 30 nm to 70 nm, such as about 50 nm to about 60 nm, a GaN layer having a thickness of 2 nm to 10 nm, such as about 5 nm to 7 nm, an InGaN layer having a thickness of 1 nm to 5 nm, such as about 3 nm to 4 nm, and a GaN barrier layer having a thickness of 10 nm to 30 nm, such as about 15 nm to 20 nm. Optionally, an AlGaN cap layer may be formed on the InGaN layer for red LEDs. The sequence of layers, composition of each layer, and the thickness of each layer within each active region 34 can be optimized to increase emission intensity and to provide the target peak emission wavelength. The active regions 34 may emit any color light, such as blue, green or red light depending on the composition of the semiconductor material therein and the strain that is applied to the semiconductor material.

A selective epitaxy process can be employed to grow the active regions 34. The process parameters of the selective epitaxy process can be selected such that the active regions 34 are grown as conformal structures having a same thickness throughout. In another embodiment, the active regions 34 can be grown as a pseudo-conformal structure in which the horizontal portions have the same thickness (such as a first thickness t1) throughout, and faceted portions have a thickness (such as a second thickness t2) that is less than the thickness of the horizontal portions. In one embodiment, each of the plurality of active regions 34 can include a top planar portion having the first thickness t1 and sidewall portions overlying tapered planar sidewalls of a respective one of the n-doped compound semiconductor regions 32 and having the second thickness t2. In one embodiment, the ratio of the first thickness t1 to the second thickness t2 can be in a range from 2 to 50, although lesser and greater ratios can also be employed. Methods for growing a layer stack for active regions 34 on nanowires are described, for example, in U.S. Pat. No. 9,444,007 to Krylyouk et al., U.S. Pat. No. 9,419,183 to Lowgren et al., U.S. Pat. No. 9,281,442 to Romano et al., and U.S. Pat. No. 8,669,574 to Konsek et al. An active region 34 contacts, surrounds, and overlies an underlying n-doped compound semiconductor region 32. In one embodiment shown in FIGS. 1A, 1B, 4A, 4B, and 4C, a single active region 34 can be formed per light emitting diode 10. In another embodiment shown in FIGS. 2A to 3B, a cluster of active regions 34 can be formed per light emitting diode 10.

A p-doped semiconductor material layer 36 is formed on the planar top surfaces and faceted outer surfaces of the active regions 34. The p-doped semiconductor material layer 36 includes a doped semiconductor material having a doping of a second conductivity type, which is the opposite of the first conductivity type. For example, if the first conductivity type is n-type, then the second conductivity type is p-type. If the first conductivity type is p-type, then the second conductivity type is n-type.

The p-doped semiconductor material layer 36 can include a compound semiconductor material. The compound semiconductor material of the p-doped semiconductor material layer 36 can be any suitable semiconductor material, such as p-type III-nitride compound semiconductor material, e.g., gallium nitride and/or aluminum gallium nitride. In one embodiment, the n-doped compound semiconductor regions 32 can include n-doped GaN or InGaN, and the p-doped semiconductor material layer 36 can include p-doped AlGaN and/or GaN. Alternatively, regions 32 and/or layer 36 can include other semiconductor materials, such as such as gallium phosphide or its ternary or quarternary compounds.

The p-doped semiconductor material layer 36 can be formed by selective deposition of the doped semiconductor material on the outer surfaces of the active regions 34. For example, a selective epitaxy process can be employed. During the selective deposition process (which can be a selective epitaxy process), discrete semiconductor material portions grow from the outer surfaces of each of the active regions until the discrete semiconductor material portions merge to form the p-doped semiconductor material layer 36 as a continuous semiconductor material layer within the area of each light emitting diode 10. In case portions of the top surface of the growth mask layer 42 are not covered by the n-doped compound semiconductor regions 32 or the active regions 34, the bottom surface of the p-doped semiconductor material layer 36 may contact such portions of the top surface of the growth mask layer 42.

Figure 4A:
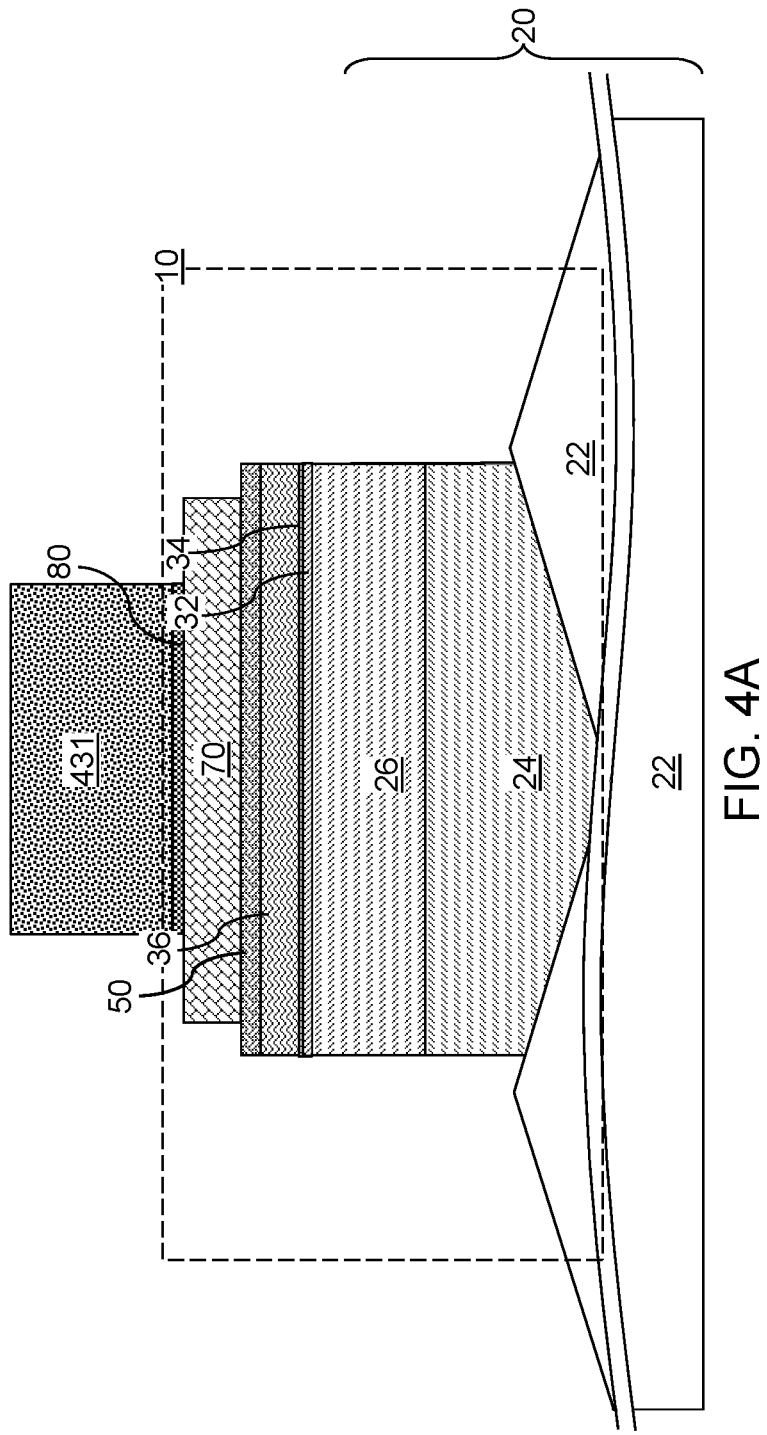
FIG. 4A is a vertical cross-sectional view of a seventh configuration of a light emitting diode according to various embodiments of the present disclosure.
Figure 4B:
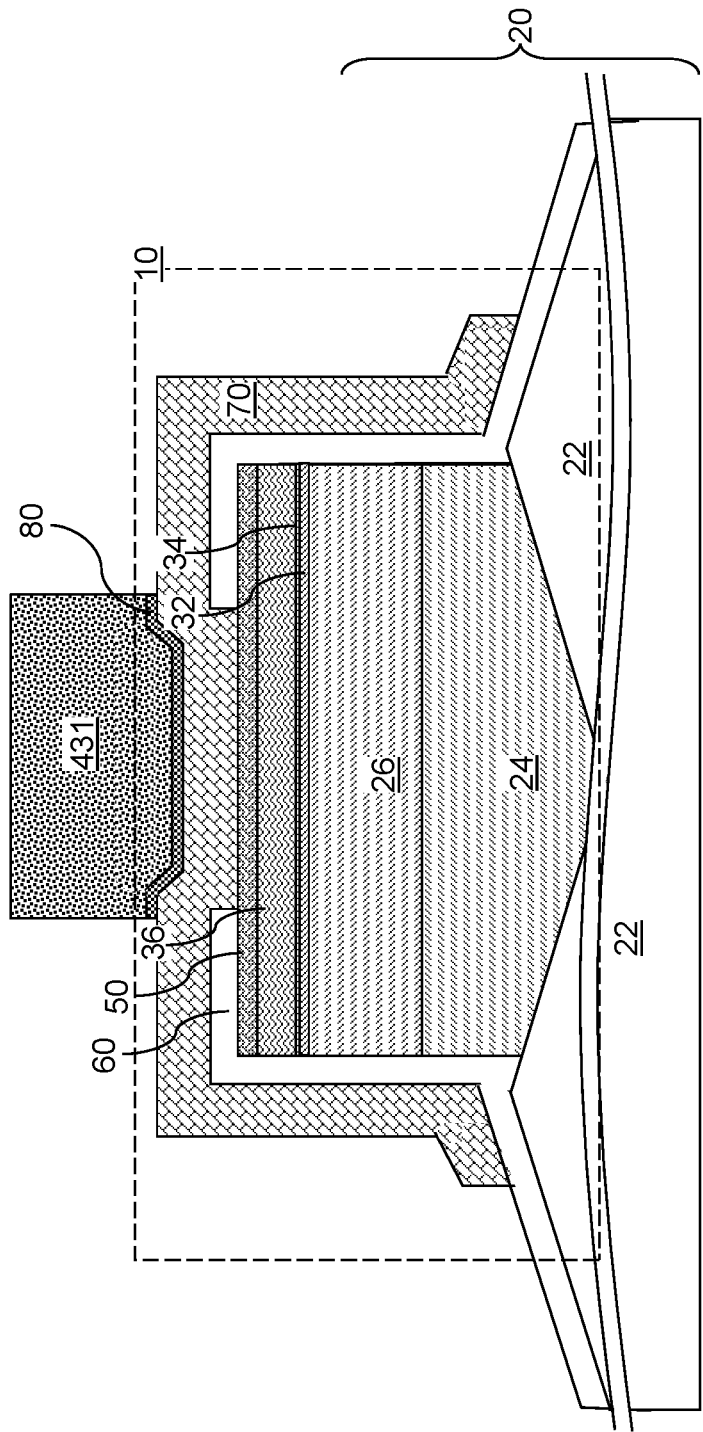
FIG. 4B is a vertical cross-sectional view of an eighth configuration of a light emitting diode according to various embodiments of the present disclosure.
Figure 4C:
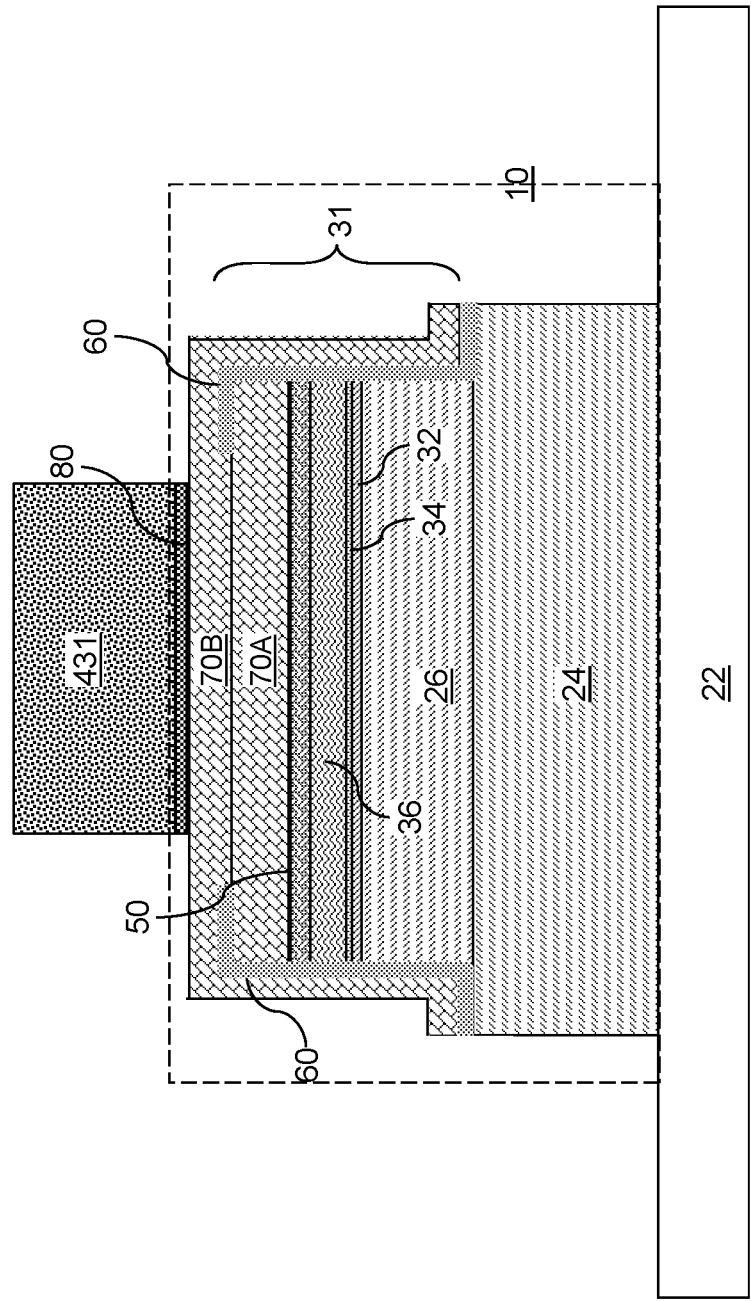
FIG. 4C is a vertical cross-sectional view of a ninth configuration of a light emitting diode according to various embodiments of the present disclosure.

With regard to FIG. 4C, a mesa 31 including the semiconductor layers 26, 32, 34, 36, the anode contact 50, and a first reflective layer 70A, may be formed on the buffer semiconductor layer 24. The mesa 31 may be formed by depositing the semiconductor layers 26, 32, 34, 36, the anode contact 50 and the first reflective layer 70A on the buffer semiconductor layer 24, followed by masking and etching these layers to form the mesa 31. A dielectric material layer 60 may be formed so as to cover the top and sides of the mesa 31. The dielectric material layer 60 includes a dielectric (i.e., electrically insulating) material such as aluminum oxide, silicon oxide, silicon nitride, organosilicate glass, silicone, a resin, a self-planarizing dielectric material, or another dielectric material. In some embodiments, the dielectric material layer 60 may be formed by any suitable method. For example, when the dielectric material layer 60 comprises aluminum oxide, the dielectric layer may be formed by atomic layer deposition (ALD).

The dielectric layer 60 may then be patterned to expose the upper surface of the first reflective layer 70A. For example, a photoresist layer can be applied over the exemplary structure, and can be lithographically patterned to form openings within each periphery of the anode contacts 50. An anisotropic etch process or an isotropic etch process can be performed employing the patterned photoresist layer as an etch mask layer. The dielectric material layer 60 may have a thickness in a range from 50 nm to 1,000 nm, such as from 100 nm to 500 nm. In some embodiments, the dielectric material layer 60 may be transparent.

A second reflective layer 70B may be formed so as to contact the exposed portion of the first reflective layer 70A and cover the dielectric layer 60. For example, the second reflective layer 70B may be formed by deposition and liftoff processes. Accordingly, the second reflective layer 70B may cover top and side surfaces of the mesa 31.

An anode contact 50 can be formed on the top surface of the p-doped semiconductor material layer 36. FIGS. 5A-5D illustrate various configurations for the p-doped semiconductor material layer 36 that can be incorporated into any of the light emitting diodes 10 illustrated in FIGS. 1A, 1B, 2A, 2B, 3A, 3B, 4A, 4B, and 4C.

FIG. 5A illustrates a first configuration of the anode contact 50. In the first configuration, the anode contact 50 can include a nickel oxide layer 51 and a transparent conductive oxide layer 53. The nickel oxide layer 51 can be formed by conformal or non-conformal deposition of nickel, and by subsequent oxidation of the deposited nickel portions. A nickel layer can be deposited, for example, by physical vapor deposition (PVD), vacuum evaporation, or chemical vapor deposition. The thickness of the nickel layer can be in a range from 0.3 nm to 100 nm, such as from 1 nm to 10 nm, although lesser and greater thicknesses can also be employed. Oxidation of the nickel layer may be performed by a thermal oxidation process or a plasma oxidation process. Alternatively, if the nickel layer is thin enough, oxygen atoms can be provided from the transparent conductive oxide layer 53 that is subsequently deposited. The thickness of the nickel oxide layer 51 can be in a range from 0.4 nm to 130 nm, such as from 1.3 nm to 13 nm, although lesser and greater thicknesses can also be employed. The nickel oxide layer 51 enhances adhesion between the p-doped semiconductor material layer 36 and the transparent conductive oxide layer 53. In one embodiment, the anode contact 50 can comprise a surface layer of nickel oxide having a thickness less than 3 nm, which can be, for example, in a range from 0.4 nm to 3 nm.

The transparent conductive oxide layer 53 can be deposited over the p-doped semiconductor material layer 36. The transparent conductive oxide layer 53 can be deposited as a continuous material layer that extends across the entire area of the p-doped semiconductor material layer 36. The thickness of the transparent conductive oxide layer 53 can be in a range from 50 nm to 600 nm, such as from 10 nm to 300 nm, although lesser and greater thicknesses can also be employed. The transparent conductive oxide layer 53 includes a transparent conductive oxide material such as a material selected from doped zinc oxide, indium tin oxide, cadmium tin oxide ($Cs_2SnO_4$), zinc stannate ($Zn_2SnO_4$), and doped titanium dioxide ($TiO_2$). Exemplary doped zinc oxide materials include boron-doped zinc oxide, fluorine doped zinc oxide, gallium doped zinc oxide, and aluminum doped zinc oxide. In one embodiment, the anode contact 50 cam be optically transparent.

FIG. 5B illustrates a second configuration of the anode contact 50. In the second configuration, the anode contact 50 can include an adhesion metal layer 52 and a silver layer 54. The combination of the adhesion metal layer 52 and the silver layer 54 provides good adhesion of the reflector layer 70 to be subsequently formed to the p-doped semiconductor material layer 36 as well as good electrical contact to the p-doped semiconductor material layer 36. The adhesion metal layer 52 directly contacts the p-doped semiconductor material layer 36. The material of the adhesion metal layer 52 can be an elemental metal that promotes adhesion. For example, the adhesion metal layer 52 can be a platinum layer consisting essentially of platinum or a nickel layer consisting essentially of nickel. The adhesion metal layer 52 can be deposited, for example, by physical vapor deposition. The thickness of the adhesion metal layer 52 (as measured over a horizontal surface) can be in a range from 2 nm to 200 nm, such as from 5 nm to 100 nm, although lesser and greater thicknesses can also be employed. The silver layer 54 can consist essentially of silver, and can be formed, for example, by physical vapor deposition. The thickness of the silver layer 54 (as measured over a horizontal surface) can be in a range from 2 nm to 200 nm, such as from 5 nm to 100 nm, although lesser and greater thicknesses can also be employed.

Figure 5D:
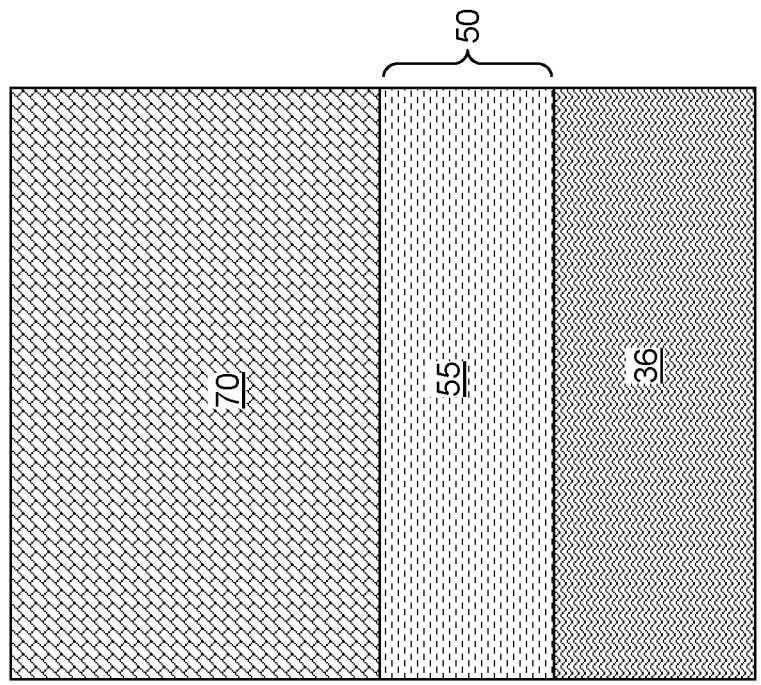
FIG. 5D illustrates of a fourth configuration of an anode contact according to various embodiments of the present disclosure.
Figure 5C:
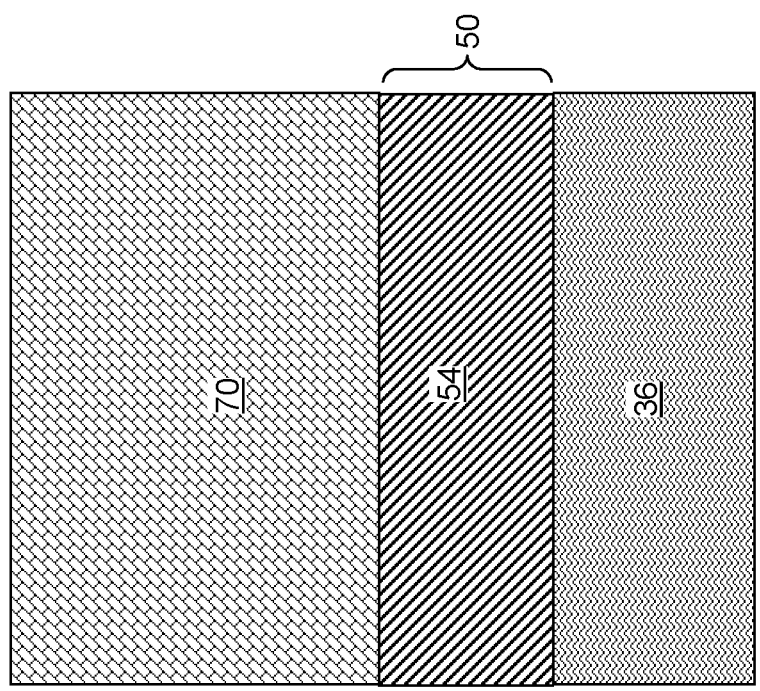
FIG. 5C illustrates of a third configuration of an anode contact according to various embodiments of the present disclosure.

FIG. 5C illustrates a third configuration of the anode contact 50. In the third configuration, the anode contact 50 can consist of a silver layer 54 that directly contacts the p-doped semiconductor material layer 36. The silver layer 54 can consist essentially of silver, and can be formed, for example, by physical vapor deposition. The thickness of the silver layer 54 (as measured over a horizontal surface) can be in a range from 2 nm to 200 nm, such as from 5 nm to 100 nm, although lesser and greater thicknesses can also be employed.

FIG. 5D illustrates a fourth configuration of the anode contact 50. In the fourth configuration, the anode contact 50 can be an NiO:Au composite layer 55 including NiO:Au composites including NiO region and Au regions. The NiO:Au composite layer 55 can be formed by forming a nickel oxide layer and depositing gold, and inducing interdiffusion of gold into the nickel oxide layer. The gold atoms segregate among the nickel oxide matrix to form the NiO:Au composite layer 55.

Alternatively, gold may be deposited first, and nickel oxide may be formed subsequently. Yet alternately, gold and nickel may be deposited as a stack of at least two layers, and oxidation and interdiffusion may be induced by thermal oxidation of nickel into nickel oxide to form the NiO:Au composite layer 55. The thickness of the NiO:Au composite layer 55 can be in a range from 2 nm to 200 nm, such as from 5 nm to 100 nm, although lesser and greater thicknesses can also be employed.

An optional dielectric material layer 60 can be subsequently formed on the physically exposed surfaces of the exemplary structure in the embodiments of FIGS. 1B, 2B, 3B and 4B. The dielectric material layer 60 includes a dielectric (electrically insulating) material such as aluminum oxide, silicon oxide, silicon nitride, organosilicate glass, silicone, a resin, a self-planarizing dielectric material, or another dielectric material. In one embodiment, the dielectric material layer 60 can be formed by a conformal deposition process such as low pressure chemical vapor deposition (LPCVD) or atomic layer deposition (ALD) (e.g., aluminum oxide formed by ALD). Alternatively, the dielectric material layer 60 can be formed by plasma enhanced chemical vapor deposition (PECVD) or spin-coating. The thickness of the portion of the dielectric material layer 60 that overlies horizontal surfaces of the anode contact 50 can be in a range from 50 nm to 1,000 nm, such as from 100 nm to 500 nm, although lesser and greater thicknesses can also be employed.

The dielectric material layer 60 can be subsequently patterned to provide an opening above each anode contact 50. For example, a photoresist layer can be applied over the exemplary structure, and can be lithographically patterned to form openings within each periphery of the anode contacts 50. An anisotropic etch process or an isotropic etch process can be performed employing the patterned photoresist layer as an etch mask layer. For example, if the dielectric material layer 60 includes silicon oxide, an isotropic etch process employing dilute hydrofluoric acid can be employed to form openings through the dielectric material layer 60. The area of each opening through the dielectric material layer 60 may be in a range from 10% to 90% of the area of an underlying anode contact 50. The sidewalls of the dielectric material layer 60 around the openings may be tapered or may be vertical. The photoresist layer can be subsequently removed, for example, by ashing.

Figure 6:
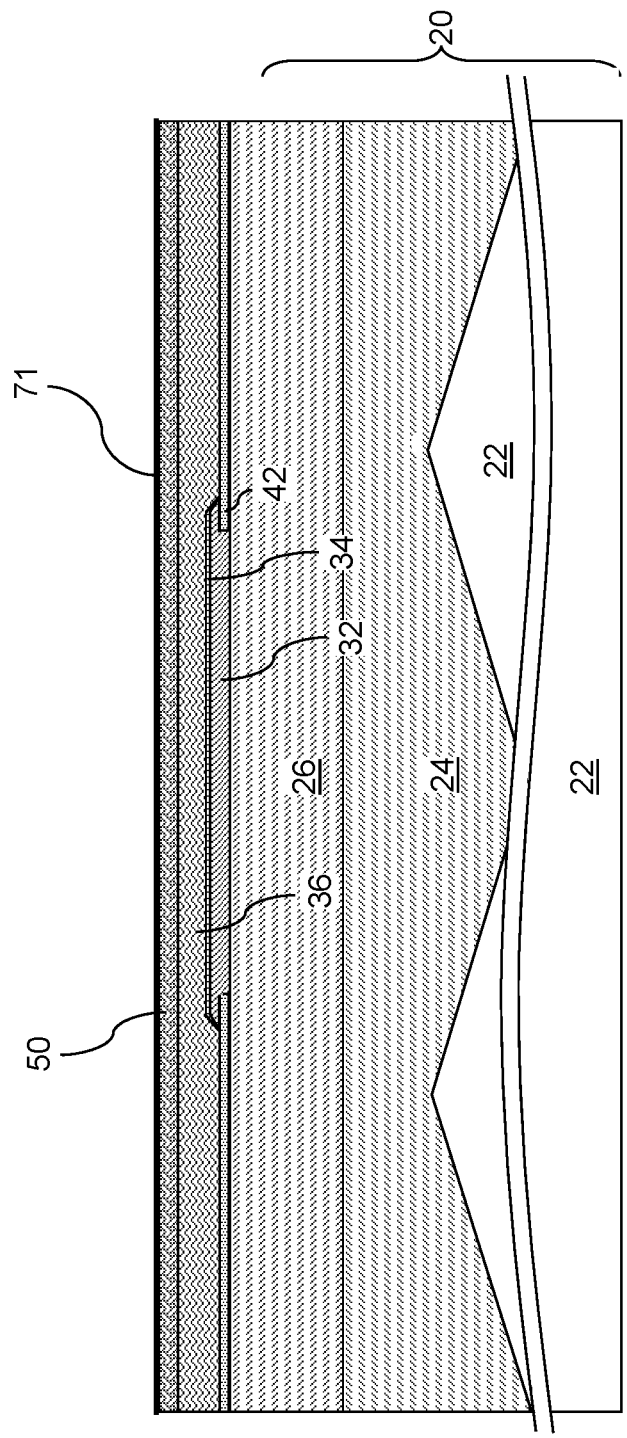
FIG. 6 is a vertical cross-sectional view of an exemplary in-process light emitting diode after deposition of a first metal layer according to various embodiments of the present disclosure.
Figure 7:
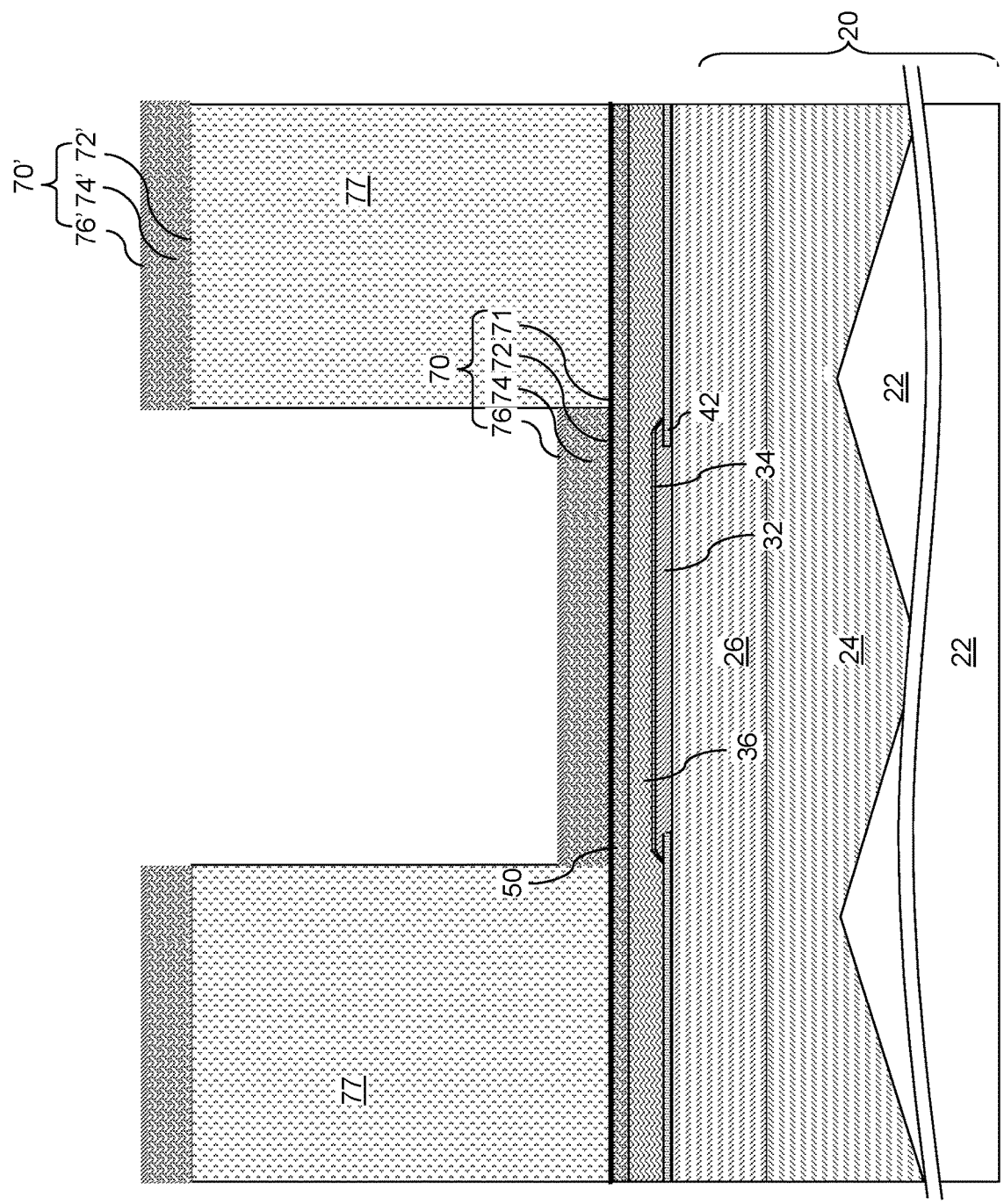
FIG. 7 is a vertical cross-sectional view of an exemplary in-process light emitting diode after formation of a patterned lift-off mask and deposition of a second metal layer, an aluminum layer, and a metallic adhesion layer according to various embodiments of the present disclosure.
Figure 8:
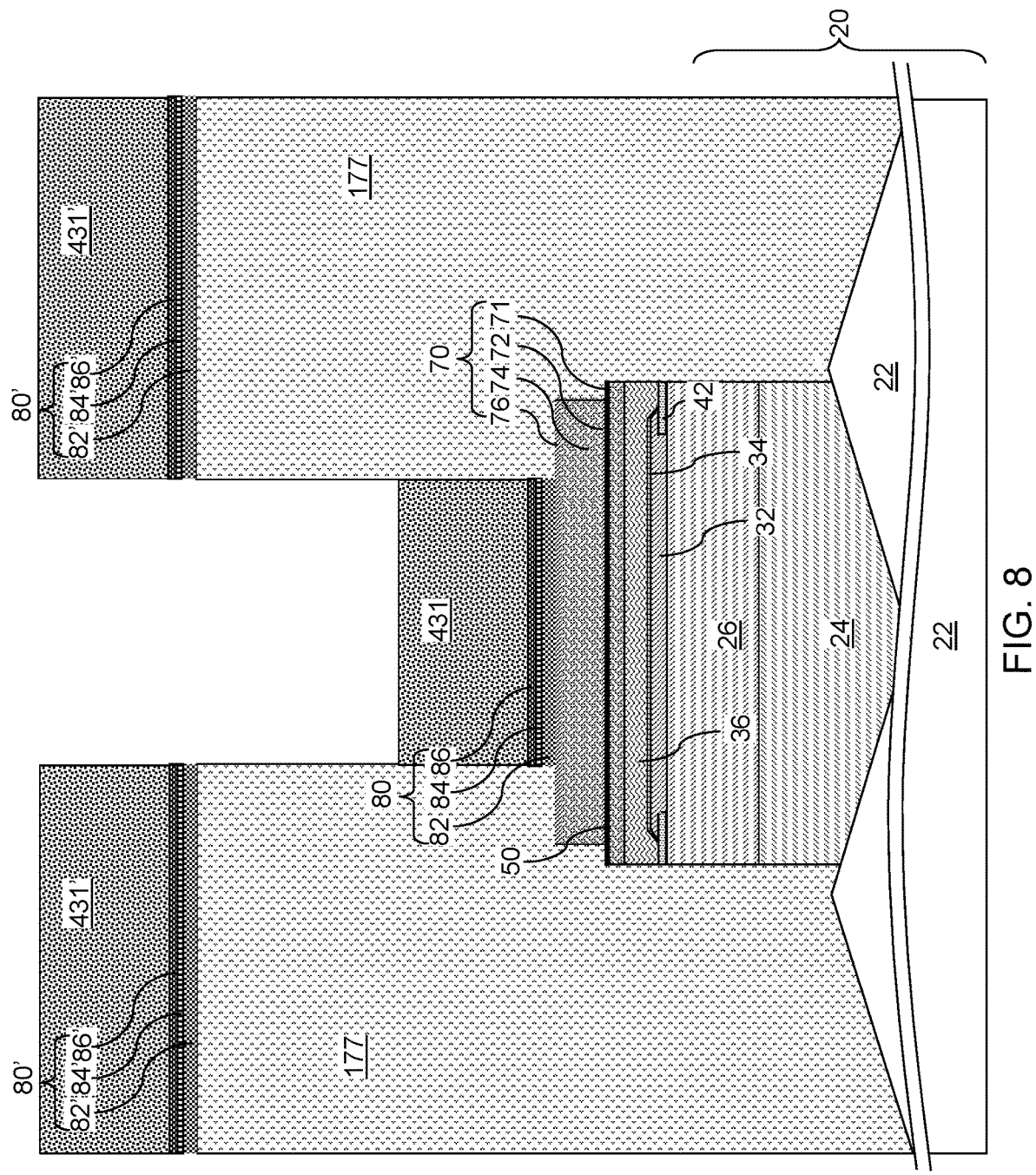
FIG. 8 is a vertical cross-sectional view of an exemplary in-process light emitting diode after lifting off the patterned lift-off mask and deposition of a first metallic bonding pad layer, a platinum layer and tin at an elevated temperature to form a device-side tin solder according to various embodiments of the present disclosure.

FIGS. 6-8 illustrate processing sequences for subsequently forming a reflective metal layer 70 for configurations (such as the configurations of FIGS. 1A, 2A, 3A, and 4A), in which the reflective metal layer 70 is formed as a planar structure that entirely overlies the top surface of an underlying anode contact 50. In such configurations, the entirety of the reflector 70 is more distal from the n-doped compound semiconductor substrate layer 26 than a most distal surface of the n-doped compound semiconductor region 32 is from the n-doped compound semiconductor substrate layer 26 within each light emitting diode 10. In the embodiments of FIGS. 1A, 2A, 3A and 4A, the reflector 70 which overlies and is electrically connected to the anode contact 50 has a smaller area than the anode contact 50.

Figure 9:
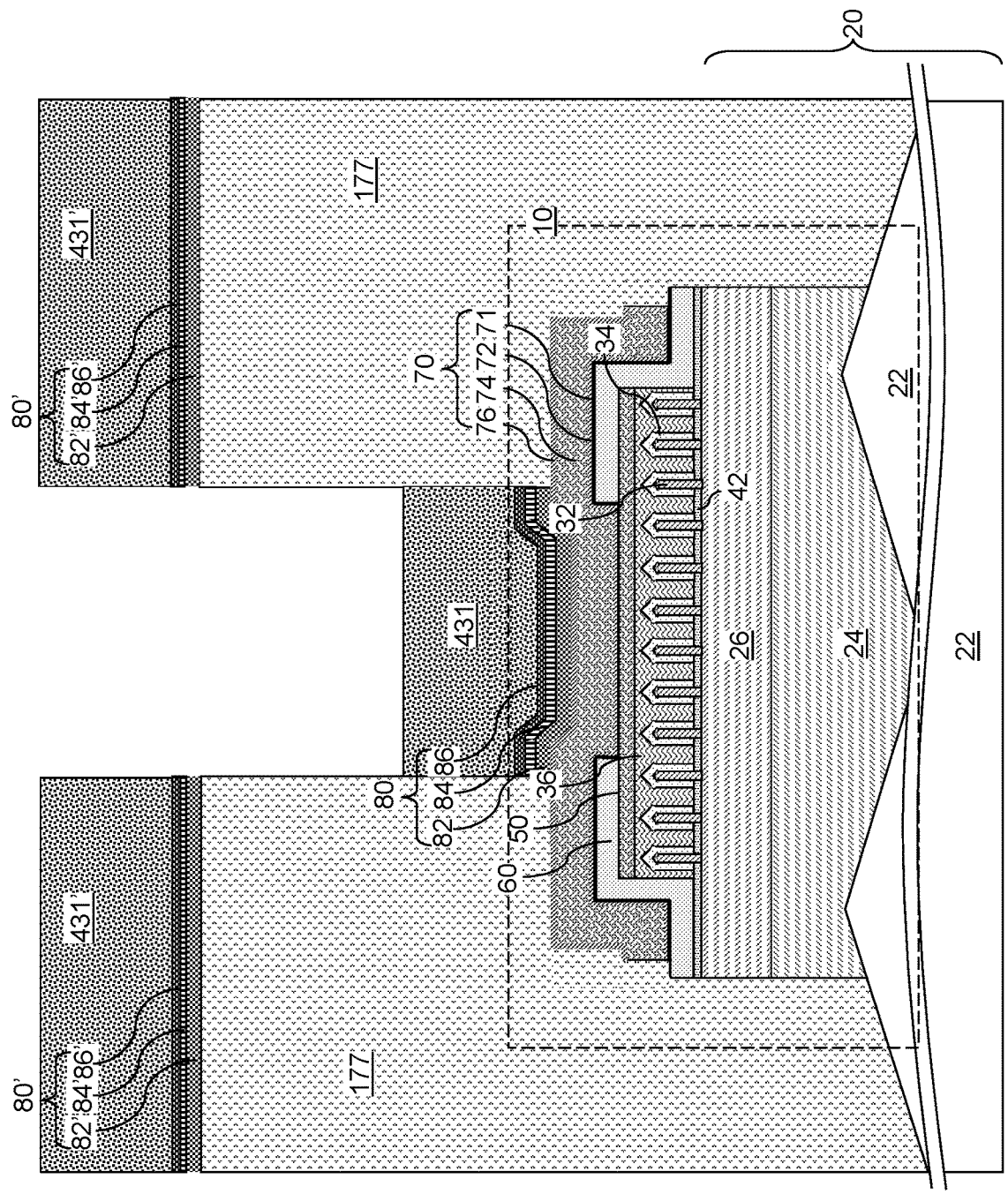
FIG. 9 is a vertical cross-sectional view of another exemplary in-process light emitting diode after deposition of a second metal layer, an aluminum layer, and a metallic adhesion layer, according to an alternative embodiment of the present disclosure.

FIG. 9 illustrates a processing step corresponding to the processing step of FIG. 7 for alternative configurations (such as the configurations of FIGS. 1B, 2B, 3B, and 4B) in which the reflective metal layer 70 is formed with a laterally-extending portion that is more distal from the n-doped compound semiconductor substrate layer 26 than a most distal surface of the p-doped semiconductor material layer 36 (which is in contact with an anode contact 50) is from the n-doped compound semiconductor substrate layer 26, and a sidewall portion adjoined to a periphery of the laterally-extending portion, extending downward therefrom, and laterally surrounding the n-doped compound semiconductor region 32, the n-doped compound semiconductor substrate layer 26, and the single crystalline buffer semiconductor layer 24 of the same light emitting device 10. It is understood that the structural features illustrated in FIGS. 6-9 can be present in each area in which a light emitting diode 10 is subsequently formed.

Referring to FIG. 6, a first metal layer 71 can be deposited directly on the physically exposed surface of the anode contact 50 and the optional dielectric material layer 60 (if present as shown in FIG. 9). The first metal layer 71 is a component of a reflector 70. The first metal layer 71 includes an adhesion promoting material such as nickel or platinum. In one embodiment, the first metal layer 71 includes nickel. The first metal layer 71 can be deposited by a non-conformal deposition process such as physical vapor deposition (PVD) or vacuum evaporation, or by a conformal deposition process such as chemical vapor deposition (CVD). The first metal layer 71 can have a first thickness in a range from 0.3 nm to 10 nm, such as from 0.6 nm to 4 nm, although lesser and greater thicknesses can also be employed.

As shown in FIGS. 7 and 9 patterned lift-off mask 77 can be formed over the first metal layer 71. The patterned lift-off mask 77 can be a patterned photoresist layer. In one embodiment, the patterned lift-off mask 77 can be formed by applying and lithographically patterning a photoresist layer with an array of openings such that each opening through the photoresist layer is entirely within a periphery of an underlying anode contact 50 as illustrated in FIG. 7.

Referring to FIGS. 7 and 9, a second metal layer 72 having the same composition as the first metal layer 71 can be subsequently anisotropically deposited, for example, by physical vapor deposition (PVD) or vacuum evaporation on the first metal layer 71 and over the patterned lift-off mask 77. The second metal layer 72 can be formed directly on the top surface of the first metal layer 71. An additional second metal layer 72' can be formed on the top surface of the patterned lift-off mask 77. The second metal layer 72 and the additional second metal layer 72 can be formed on the physically exposed surface of the first metal layer 71 and over the patterned lift-off mask 77 around each area of the light emitting diodes 10. The second metal layer 72 includes the same metal as the first metal layer 71 to maximize adhesion strength between the first metal layer 71 and the second metal layer 72. In one embodiment, the first metal layer 71 and the second metal layer 72 include an elemental metal such as nickel or platinum. The thickness of the second metal layer 72 over horizontal surfaces can be in a range from 0.3 nm to 40 nm, such as from 0.4 nm to 6 nm, although lesser and greater thicknesses can also be employed.

Around each area of a light emitting diode 10, a combination of the first metal layer 71 and the second metal layer 72 is deposited within a center region of the light emitting diode 10, while only the first metal layer 71 is deposited in a peripheral region, which is located outside a periphery of the center region. The center region may be entirely within the area defined by the periphery of an anode contact 50. The peripheral region can have an inner periphery that coincides with a periphery of the center region. Specifically, the inner periphery of the peripheral region can coincide with the sidewalls of the patterned lift-off mask 77.

The combination of the first metal layer 71 and the second metal layer 72 constitutes a single metal layer having two different thicknesses. Specifically, the combination of the first metal layer 71 and the second metal layer 72 constitutes a dual thickness metal adhesion layer (71, 72) having a first thickness at a peripheral region (i.e., the region in which only the first metal layer 71 is deposited) and having a second thickness that is greater than the first thickness at a center region (i.e., the region in which both the first metal layer 71 and the second metal layer 72 are deposited). In one embodiment, the first thickness is in a range from 0.3 nm to 10 nm, and the second thickness in a range from 0.6 nm to 50 nm. In another embodiment, the first thickness is in a range from 0.6 nm to 4 nm, and the second thickness in a range from 1 nm to 10 nm.

Aluminum can be deposited by an anisotropic deposition method (such as sputtering or vacuum evaporation). An aluminum layer 74 can be formed directly on the dual thickness metal adhesion layer (71, 72) over the anode contact 50, and an additional aluminum layer 74' can be formed on the additional second metal layer 72' over the patterned lift-off mask 77. The aluminum layer 74 can consist essentially of aluminum. The aluminum layer 74 provides malleability during subsequent laser processing process, such as laser ablation processes and laser solder processes, so that active regions 34 of the light emitting devices 10 are protected from mechanical shock and/or structural damage. A metal having a higher malleability, such as gold or silver, may also be used in lieu of aluminum. Horizontal portions of the aluminum layer 74 can have a thickness in a range from 200 nm to 3,000 nm, such as from 800 nm to 2,000 nm, over the dual thickness metal adhesion layer (71, 72).

A metallic adhesion material can be deposited over the aluminum layer 74 by an anisotropic deposition process such as physical vapor deposition or vacuum evaporation. The metallic adhesion material can include an elemental metal such as nickel or platinum. A metallic adhesion layer 76 is formed on the top surface of the aluminum layer 74 overlying the anode contact 50, and an additional metallic adhesion layer 76' is formed on the additional aluminum layer 74' over the patterned lift-off mask 77. Horizontal portions of the metallic adhesion layer 76 can have a uniform thickness, which can be in a range from 1 nm to 300 nm, such as from 10 nm to 100 nm, although lesser and greater thicknesses can also be employed. The stack of the dual thickness metal adhesion layer (71, 72), the aluminum layer 74, and the metallic adhesion layer 76 constitutes a reflector 70, which can function as a reflector and a portion of an anode of the light emitting device 10. The stack of the additional metallic adhesion layer 76', the additional aluminum layer 74', and the additional second metal layer 72' constitute an additional reflector 70'.

Referring to FIG. 8, the patterned lift-off mask 77 and material layers thereupon (such as the additional reflector 70') can be removed employing a lift-off process. For example, the exemplary structure can be immersed in a solvent that dissolves the material of the patterned lift-off mask 77. A suitable clean process can be performed to remove residual materials of the additional reflector 70'.

A photoresist layer (not shown) can be applied over the exemplary structure and lithographically patterned to cover each area of the light emitting diodes 10. The patterned areas of the photoresist layer can be arranged as a two-dimensional array with channels (corresponding to areas from which the material of the photoresist layer is removed during development) laterally surrounding each area of the light emitting diodes 10. An anisotropic etch process is performed to pattern the anode contact 50, the p-doped semiconductor material layer 36, the active regions 34, the n-doped compound semiconductor regions 32, the growth mask layer 42 (if present), the n-doped compound semiconductor substrate layer 26, and the single crystalline buffer semiconductor layer 24. The anisotropic etch process can stop on the support substrate 22.

In the embodiments shown in FIGS. 1A, 2A, 3A and 4A, the areas of the openings in the photoresist layer extend beyond the entire respective areas of the underlying patterned reflector 70. Thus, the reflector 70 which is patterned in the prior lift-off step is not etched during above etching step. This avoids the relatively difficult metal etch. In these embodiments, the reflector 70 which has a smaller area than the anode contact 50.

Alternatively, in the embodiments shown in FIGS. 1B, 2B, 3B and 4B, the metal reflector 70 is also etched during the above etching step. In these embodiments, the metal etch is performed to form the metal reflector 70 that extends partially over the sidewalls of the LEDs 10 to improve the reflection of the light emitted by the LEDs 10. After etching, the photoresist layer can be removed, for example, by ashing.

Each etched mesa comprising a contiguous set of patterned portions of the reflector 70, anode contact 50, the p-doped semiconductor material layer 36, the active regions 34, the n-doped compound semiconductor regions 32, the growth mask layer 42 (if present), the n-doped compound semiconductor substrate layer 26, and the single crystalline buffer semiconductor layer 24 constitute components of a respective light emitting diode 10. An optional dielectric layer, such as aluminum oxide, silicon oxide, or silicon nitride, can be deposited over the sidewalls of the etched mesa while exposing the top surface of the reflector 70. In case the n-doped compound semiconductor substrate layer 26 and the single crystalline buffer semiconductor layer 24 are patterned as discrete material portions prior to formation of the n-doped compound semiconductor regions 32 (as in the case of the alternative configurations of FIGS. 4A and 4B), the above patterning step may be optionally omitted. In this case, thin material layers having the same material compositions as the active regions 34 and the n-doped compound semiconductor regions 32 can be formed on the sidewalls of the patterned portions of the n-doped compound semiconductor substrate layer 26 and the single crystalline buffer semiconductor layer 24, and the p-doped semiconductor material layer 36 can extend to sidewalls of such thin material layers at the periphery of each light emitting diode 10.

As shown in FIGS. 8 and 9 a second patterned lift-off mask 177 can be formed over the first metal layer 71. The second patterned lift-off mask 177 can be a patterned photoresist layer. In one embodiment, the second patterned lift-off mask 177 can be formed by applying and lithographically patterning a photoresist layer with an array of openings. Subsequently, material layers for forming a device-side bonding pad can be deposited. For example, a first metallic bonding pad metal can be anisotropically deposited to form a first metallic bonding pad layer 82 and a first metallic material layer 82'. The first metallic bonding pad layer 82 can be deposited directly on the metallic adhesion layer 76 overlying the anode contact 50 and the reflector 70, and the first metallic material layer 82' can be deposited on a top surface of the second patterned lift-off mask 177. The first metallic bonding pad layer 82 and the first metallic material layer 82' can include a transition metal such as titanium or tantalum. In one embodiment, the first metallic bonding pad layer 82 and the first metallic material layer 82' can consist essentially of titanium or tantalum. Horizontal portions of the first metallic bonding pad layer 82 and the first metallic material layer 82' can have a thickness in a range from 30 nm to 300 nm, such as from 60 nm to 200 nm, although lesser and greater thicknesses can also be employed. The first metallic bonding pad layer 82 is electrically connected to the anode contact 50 through the reflector 70.

A second metallic bonding pad metal can be anisotropically deposited to form a second metallic bonding pad layer 84 and a second metallic material layer 84'. The second metallic bonding pad layer 84 can be deposited directly on the first metallic bonding pad layer 82 overlying the anode contact 50 and the reflector 70, and the second metallic material layer 84' can be deposited on a top surface of the first metallic material layer 82' over the patterned lift-off mask 77. The second metallic bonding pad layer 84 and the second metallic material layer 84' can include an adhesion promoting metal having a melting temperature greater than 1,500 degrees Celsius. In one embodiment, the second metallic bonding pad layer 84 and the second metallic material layer 84' can consist essentially of platinum. Horizontal portions of the second metallic bonding pad layer 84 and the second metallic material layer 84' can have a thickness in a range from 50 nm to 500 nm, such as from 100 nm to 250 nm, although lesser and greater thicknesses can also be employed.

The exemplary structure is placed in an environment having an elevated temperature, which can be in a range from 100 degrees Celsius to 230 degrees Celsius (i.e., below the tin melting point), such as from 120 degrees Celsius to 200 degrees Celsius. Tin is deposited within each area inside an outer periphery of a topmost surface of the second metallic bonding pad layer 84 and on the second metallic material layer 84' at the elevated temperature. Either pure tin (containing only unavoidable impurities) or tin containing less than 1 atomic percent (e.g., 0.5 atomic percent or less) of silver and/or copper as a dendrite prevention element is deposited in this step. Tin is a high temperature solder material, and provides a controlled reflow during a laser solder process that is subsequently employed. The elevated temperature during deposition of tin induces diffusion of tin into the second metallic bonding pad layer 84 during the deposition of tin onto the second metallic bonding pad layer 84.

A third metallic bonding pad layer 86 and a third metallic material layer 86' comprising an alloy (e.g., intermetallic) of platinum and tin is formed in upper regions of the respective second metallic bonding pad layer 84 and the second metallic material layer 84' into which tin diffuses. The third metallic bonding pad layer 86 may contain between 60 and 80 weight percent tin and 20 to 40 weight percent platinum. The remaining lower portion of the second metallic bonding pad layer 84 includes tin at an atomic concentration less than 0.5% in atomic concentration, and is considered to be the remaining second metallic bonding pad layer 84. Thus, the second metallic bonding pad layer 84 can include surface portions including tin at an atomic concentration less than 0.5%, and can include a portion that consists essentially of platinum. The entire volume of the second metallic bonding pad layer 84 includes platinum at an atomic concentration of at least 99%, such as at least 99.5%. The unreacted portion of the deposited tin forms a tin portion 431. The tin portion 431 can include tin at an atomic concentration of at least 99%, such as at least 99.5% and may optionally include 0.5 atomic percent of silver and/or copper.

The thickness of the tin portion 431 can be in a range from 1 micron to 10 microns, such as from 1.5 micron to 4 microns. The first metallic bonding pad layer 82, the second metallic bonding pad layer 84, and the third metallic bonding pad layer 86 collectively constitute a device-side bonding pad 80. The thickness of the third metallic bonding pad layer 86 can be less than the thickness of the second metallic bonding pad layer 84. For example, the thickness of the second metallic bonding pad layer 84 can be in a range from 50 nm to 500 nm, such as from 100 nm to 250 nm. The thickness of the third metallic bonding pad layer 86 can be in a range from 40 nm to 400 nm, such as from 80 nm to 200 nm. Each region of the tin portion 431 includes tin at an atomic concentration of at least 99%. Regions of the tin portion 431 that are spaced from the device-side bonding pad 80 by more than 200 nm can consist essentially of tin. The tin to platinum volume ratio in the device-side bonding pad 80 can be at least 30:1, such as at least 50:1, for example 100:1 to 30:1. The stack of the third metallic material layer 86', the second metallic material layer 84' and the first metallic material layer 82' constitutes a metallic material layer stack 80'.

Referring back to FIGS. 1A and 3B, the second patterned lift-off mask 177 and material layers thereupon (such as the metallic material layer stack 80') can be removed employing a lift-off process. For example, the exemplary structure can be immersed in a solvent that dissolves the material of the second patterned lift-off mask 177. A suitable clean process can be performed to remove residual materials of the metallic material layer stack 80'.

In one embodiment, the first metallic bonding pad layer 82 can consist essentially of titanium, and the second metallic bonding pad layer 84 can consist essentially of platinum. In one embodiment, the first metallic bonding pad layer 82 can have a thickness in a range from 30 nm to 300 nm, the thinned portion of the second metallic bonding pad layer 84 can have a thickness in a range from 10 nm to 200 nm, the third metallic bonding pad layer 86 can have a thickness in a range from 40 nm to 400 nm within areas in which the tin portion 431 contacts the third metallic bonding pad layer 84, and the tin portion 431 can have a thickness in a range from 1 micron to 10 microns.

Direct View Display Manufacturing

Figure 10A:
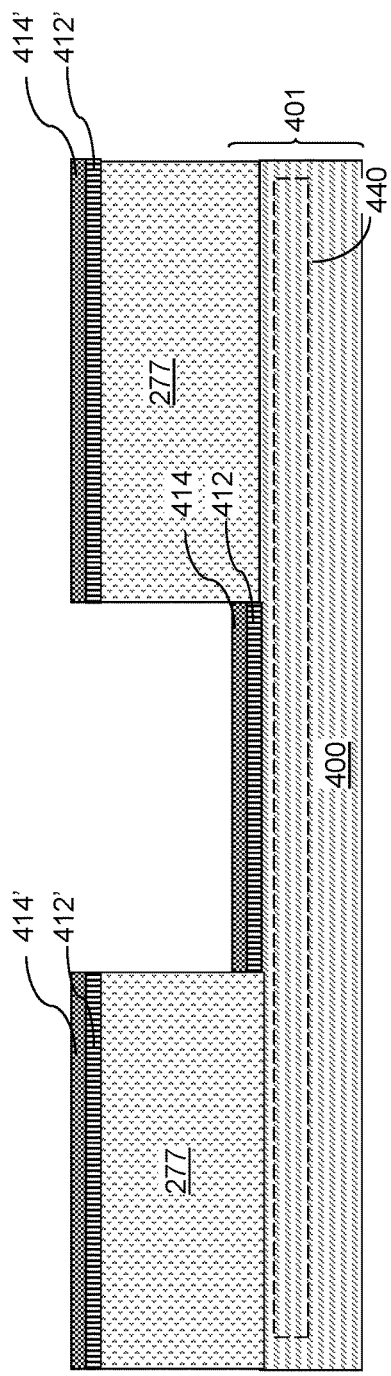
FIG. 10A is a vertical cross-sectional view of a backplane during formation of a backplane-side bonding pad according to various embodiments of the present disclosure.
Figure 10B:
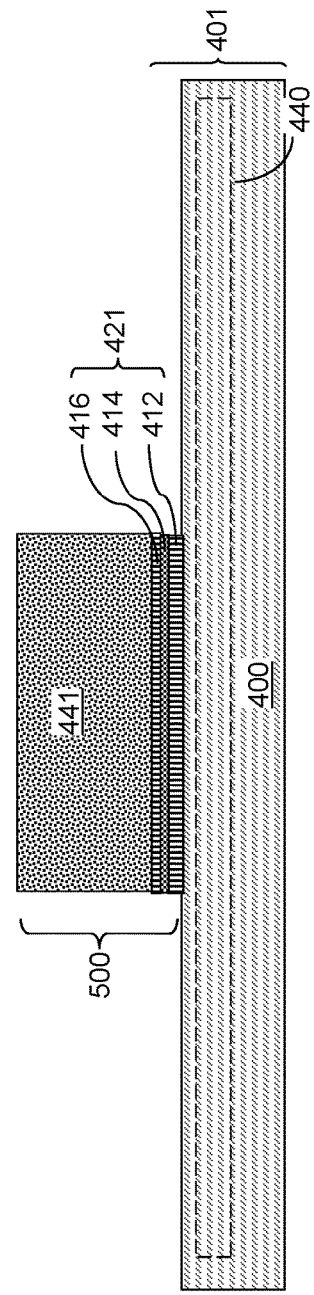
FIG. 10B is a vertical cross-sectional view of the backplane after deposition of tin to form a backplane-side tin solder according to various embodiments of the present disclosure.
Figure 10C:
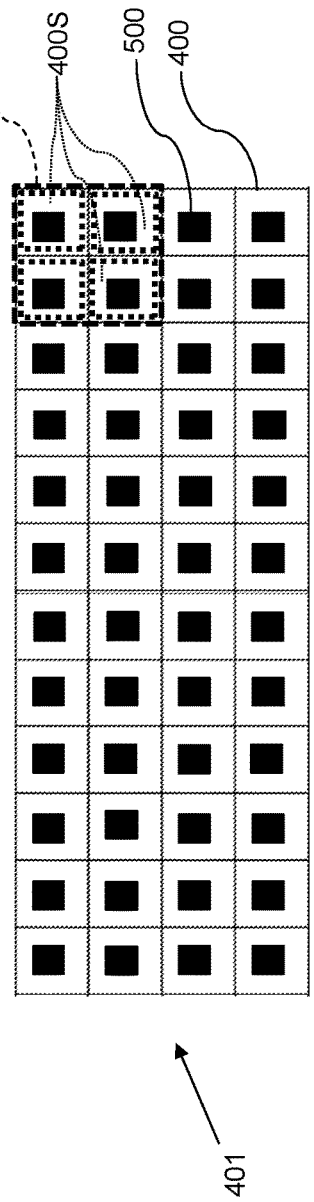
FIG. 10C is a top view of a backplane according to various embodiments of the present disclosure.

A direct view display device can be formed by transferring the light emitting diodes 10 of FIGS. 1A, 1B, 2A, 2B, 3A, 3B, 4A, and/or 4B to a backplane. The process of forming a backplane-side bonding pad 421 is illustrated in FIGS. 10A and 10B. A top view of a backplane 401 is shown in FIG. 10C.

Referring to FIG. 10A, a backplane 401 is illustrated during formation of backplane-side bonding pads 421. While only a single backplane-side bonding pad 421 is illustrated herein, it is understood that an array of backplane-side bonding pads 421 is formed on a front surface of the backplane 401 to form a direct view display device. The backplane 401 includes a backplane substrate 400 within a backplane driver circuitry 440 embedded therein. As used herein, a "backplane substrate" refers to any substrate configured to affix multiple devices thereupon. The backplane driver circuitry 440 may include an array of active devices (such as field effect transistors) and/or metal interconnect structures. The metal interconnect structures can provide electrical connection between the backplane-side bonding pads 421 and the active devices and/or between the backplane-side bonding pads 421 and an input/output port of the backplane 401.

Generally, the same set of processing steps employed to form device-side bonding pads 80 can be employed to form an array of backplane-side bonding pads 421 on the front side of the backplane substrate 400. For example, a lift-off mask 277 can be formed on the top surface of the backplane substrate 400 by depositing and patterning a photoresist layer. The photoresist layer can be patterned to form openings in regions in which a backplane-side bonding pad 421 is to be subsequently formed. Material layers for forming backplane-side bonding pads 421 can be deposited. For example, a first backplane-side bonding pad metal can be anisotropically deposited to form a first backplane-side bonding pad layer 412 and a first metallic material layer 412'. The first backplane-side bonding pad layer 412 can be deposited directly on the physically exposed portions of the top surface of the backplane substrate 400, and the first metallic material layer 412' can be deposited on a top surface of the patterned lift-off mask 277. The first backplane-side bonding pad layer 412 and the first metallic material layer 412' can include a transition metal such as titanium or tantalum. In one embodiment, the first backplane-side bonding pad layer 412 and the first metallic material layer 412' can consist essentially of titanium or tantalum. Horizontal portions of the first backplane-side bonding pad layer 412 and the first metallic material layer 412' can have a thickness in a range from 30 nm to 300 nm, such as from 60 nm to 200 nm, although lesser and greater thicknesses can also be employed. The first backplane-side bonding pad layer 412 is electrically connected to the anode contact 50.

A second backplane-side bonding pad metal can be anisotropically deposited to form a second backplane-side bonding pad layer 414 and a second metallic material layer 414'. The second backplane-side bonding pad layer 414 can be deposited directly on the first backplane-side bonding pad layer 412, and the second metallic material layer 414' can be deposited on a top surface of the first metallic material layer 412' over the patterned lift-off mask 277. The second backplane-side bonding pad layer 414 and the second metallic material layer 414' can include an adhesion promoting metal having a melting temperature greater than 1,500 degrees Celsius. In one embodiment, the second backplane-side bonding pad layer 414 and the second metallic material layer 414' can consist essentially of platinum. The second backplane-side bonding pad layer 414 and the second metallic material layer 414' can have a thickness in a range from 50 nm to 500 nm, such as from 100 nm to 250 nm, although lesser and greater thicknesses can also be employed.

The backplane 401 can be subsequently placed in an environment having an elevated temperature, which can be in a range from 100 degrees Celsius to 230 degrees Celsius, such as from 120 degrees Celsius to 200 degrees Celsius. Either pure tin or tin containing less than 1 atomic percent Ag and/or Cu can be deposited. Tin is deposited within each area inside an outer periphery of a topmost surface of the second backplane-side bonding pad layer 414 at the elevated temperature. Tin is a high temperature solder material, and reduces reflow during a laser solder process that is subsequently employed. The elevated temperature during deposition of tin induces diffusion of tin into the second backplane-side bonding pad layer 414 during the deposition of tin onto the second backplane-side bonding pad layer 414.

A third backplane-side bonding pad layer 416 comprising an alloy (e.g., intermetallic) of platinum and tin is formed in an upper region of the second backplane-side bonding pad layer 414 into tin diffuses. The third backplane-side bonding pad layer 416 may contain between 60 and 80 weight percent tin and 20 to 40 weight percent platinum. The remaining lower portion of the second backplane-side bonding pad layer 414 includes tin at an atomic concentration less than 0.5% in atomic concentration, and is considered to be the remaining second backplane-side bonding pad layer 414. Thus, the second backplane-side bonding pad layer 414 can include surface portions including tin at an atomic concentration less than 0.5%, and can include a portion that consists essentially of platinum. The entire volume of the second backplane-side bonding pad layer 414 includes platinum at an atomic concentration of at least 99%, such as at least 99.5%. The unreacted portion of the deposited tin forms a backplane-side tin portion 441, which may be referred to herein as a backplane solder layer, and a sacrificial tin portion on the patterned lift-off mask 277. The solder layer 441 can include a solder material including tin at an atomic concentration of at least 99%, such as at least 99.5% and may optionally include 0.5 atomic percent of silver and/or copper. However, the present disclosure is not limited to any particular type of solder material.

Referring to FIG. 10B, the patterned lift-off mask 277 and material layers thereupon (such as the second metallic material layer 414', the first metallic material layer 412' and the sacrificial tin portion) can be removed employing a lift-off process. For example, the backplane 401 and the patterned lift-off mask 277 can be immersed in a solvent that dissolves the material of the patterned lift-off mask 277. A suitable clean process can be performed to remove residual materials from the second metallic material layer 414' and the first metallic material layer 412'.

The first backplane-side bonding pad layer 412, the second backplane-side bonding pad layer 414, and the third backplane-side bonding pad layer 416 collectively constitute a backplane-side bonding pad 421. The bonding pad 421 and adjacent solder layer 441 form a backplane bonding structure 500. Each backplane solder layer 441 may include tin at an atomic concentration of at least 99%. Regions of the backplane-side tin portion 441 that are spaced from the backplane-side bonding pad 421 by more than 200 nm can consist essentially of tin. The tin to platinum volume ratio in the combination of the backplane-side bonding pad 421 and the backplane solder layer 441 can be at least 30:1, such as at least 50:1, for example 100:1 to 30:1.

In one embodiment, the first backplane-side bonding pad layer 412 can consist essentially of titanium, and the second backplane-side bonding pad layer 414 can consist essentially of platinum. In one embodiment, the first backplane-side bonding pad layer 412 can have a thickness in a range from 30 nm to 300 nm, the thinned portion of the second backplane-side bonding pad layer 414 can have a thickness in a range from 10 nm to 200 nm, the third backplane-side bonding pad layer 416 can have a thickness in a range from 40 nm to 400 nm, and the backplane solder layer 441 can have a thickness in a range from 1 micron to 10 microns, such as 1.5 to 4 microns.

Referring to FIG. 10C, the backplane 401 may include multiple bonding structures 500, which may be arranged on a surface of the backplane substrate 400 in pixel regions 400P. Each pixel region 400P corresponds to a location of one pixel of a display device and contains four subpixel regions 400S. In particular, each pixel region 400P may include at least three bonding structures 500. For example, as shown in FIG. 10C, each pixel region 400P may include four bonding structures 500. Pixels of a display device may be formed by bonding at least three LEDs to the bonding structures 500, where one bonding structure 500 is located in each subpixel region 400S. In particular, the LEDs 10 bonded to the bonding structures 500 of one pixel region 400P may together form one pixel of a display device, and each LED 10 may operate as a sub-pixel thereof. For example, there may be three LEDs 10 which emit a peak wavelength of a different color (e.g., blue, green and red) may be bonded to a respective bonding structure 500 in each pixel region 400P. The fourth bonding structure 500 may be used to bond a sensor, a repair LED (in case one of the bonded LEDs 10 is defective) or a second LED 10 which emits the peak wavelength of the same color (e.g., blue, green or red) as one of the other LEDs 10 bonded in the same pixel region 400P.

FIG. 11A is a top view of a growth substrate (e.g., semiconductor or sapphire wafer) according to various embodiments of the present disclosure, and FIGS. 11B and 11C are top views showing one of the pixel regions 22P of a comparative example and of an embodiment example, respectively, that may be included on the growth substrate 22 of FIG. 11A. Referring to FIG. 11A, a growth substrate 22 may be divided into many pixel regions 22P. Each pixel region 22P may have dimensions configured to match the dimensions of the pixel region 400P of the backplane 401 of a corresponding display device which is shown in FIG. 10C. For example, each pixel region 22P may be a rectangular region of the growth substrate 22 that corresponds in size to pixel region 400P of a display device, such as a direct view display. Each pixel region 22P has four subpixel regions 22S which have the same area as the respective subpixel regions 400S on the backplane 401.

Generally, as shown in FIG. 11B, in order to allow the LEDs 10 to be transferred to corresponding pixel regions 400P of a backplane 401 without physically interfering with previously or subsequently deposited LEDs 10 in the same pixel region 400P, each comparative example subpixel region 22S may include one LED 10. As such, the LEDs 10 may occupy only a relatively small fraction of the surface area of the growth substrate 22. For example, each LED 10 may only occupy a 20×20 μm portion of a corresponding 96×96 μm subpixel region 22S. As such, a substantial amount of the surface area of the growth substrate 22 may remain unutilized for LED formation, in order to facilitate LED transfer. This increases the production cost of the device because of decreased LED 10 density on the growth substrate 22.

As shown in FIG. 11C, in order to increase growth substrate utilization, multiple LEDs 10 can be formed in each subpixel region 22S according to an embodiment of the present disclosure, such that the LED 10 density on the growth substrate 22 is increased. In particular, a higher LED 10 density increases the utilization of the relatively expensive sapphire growth substrate 22, thereby substantially reducing LED production costs.

For example, each subpixel region 22S may include 2 to 50 LEDs, such as 10 to 20 LEDs, such as sixteen 20×20 μm LEDs 10 shown in FIG. 11C. However, in other embodiments, other numbers of LEDs 10 may be used. For example, nine 20×20 μm LEDs may be located in each subpixel region 22S. In other embodiments, more than 16 LEDs 10 may be formed in each subpixel region 22S by reducing the size thereof correspondingly, such as by forming 64 smaller LEDs in each subpixel region 22S.

As discussed in detail below, the embodiments of the present disclosure provide various methods for utilizing growth substrates having a LED density of greater than one LED per pixel region. In particular, various embodiments provide for the modification of the LED thicknesses, in order to reduce and/or prevent interference between LEDs during LED transfer to a backplane.

Figure 12:
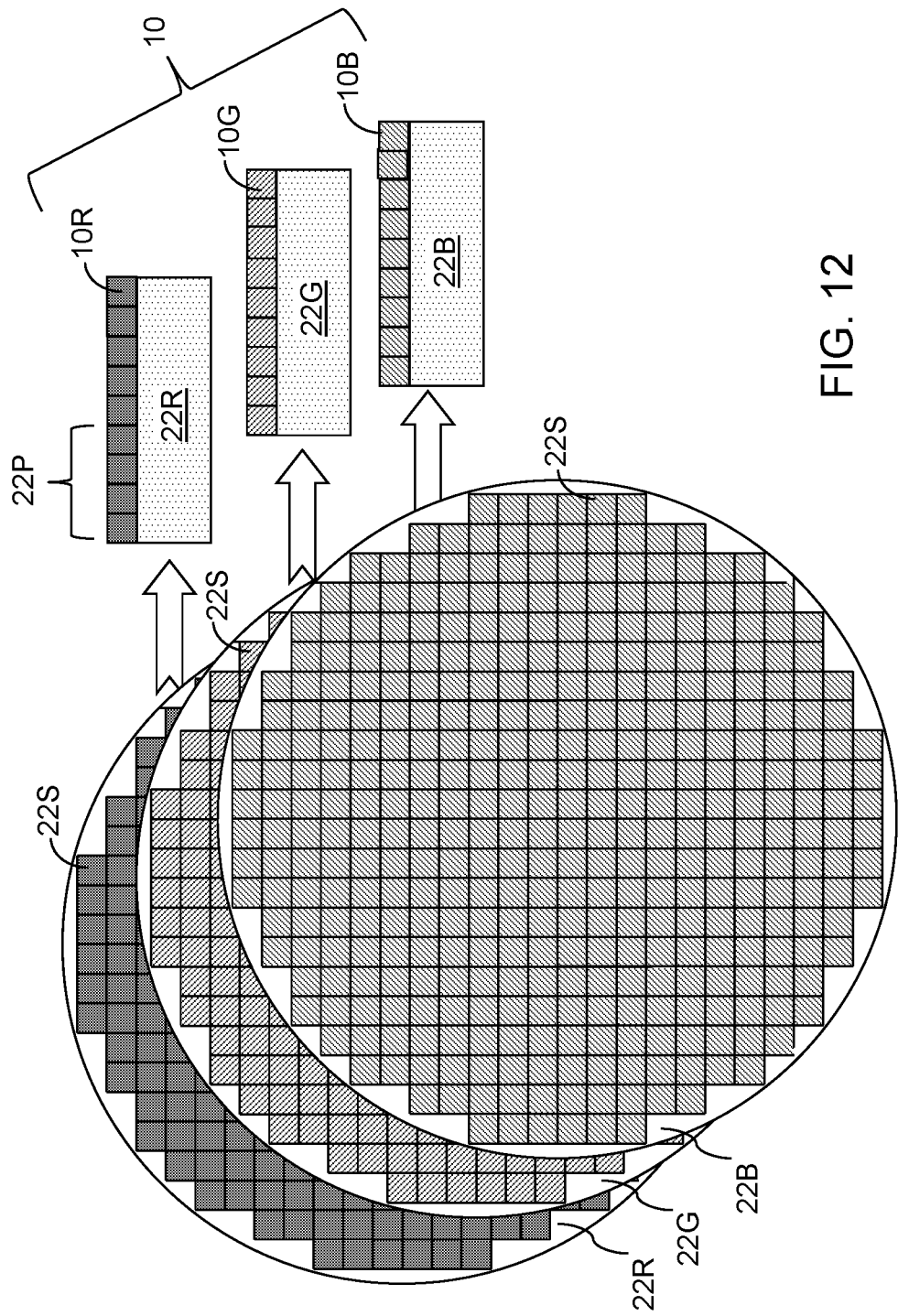
FIG. 12 is a top view of semiconductor wafers and coupons, according to various embodiments of the present disclosure.

FIG. 12 illustrates the formation of transfer units or "coupons" from LED growth substrates (e.g., wafers), according to various embodiments of the present disclosure. Referring to FIG. 12, growth substrates 22 may include LEDs 10 disposed in pixel regions 22P. The LEDs 10 may have any of the structures shown in FIGS. 1A, 1B, 2A, 2B, 3A, 3B, 4A, and/or 4B. The growth substrates 22 may each include LEDs 10 that emit a particular color of light (e.g., have a primary emission peak wavelength), such as blue, green or red.

Each wafer 22 may optionally be cut into first, second, or third transfer substrates 22B, 22G, 22R, which may be referred to herein as first, second, and third "coupons". Each coupon 22R, 22G, 22B may include a rectangular array of LEDs 10 disposed in pixel regions 22P. The LEDs 10 of each coupon 22R, 22G, 22B may all emit a particular color of light. For example, the first coupon 22B may include LEDs 10B that may emit blue light, the second coupon 22G may include LEDs 10G that emit green light, and the third coupon 22R may include LEDs 10R that emit red light. However, the present disclosure is not limited to any particular LED emission color. In the alternative, the coupons 22R, 22G, 22B may not be formed, and LEDs 10 may be transferred directly from the respective growth substrates (e.g., wafers) 22 to a backplane. However, for simplicity of explanation, the following methods will be described with respect to the coupons 22R, 22G, 22B.

Figure 13A:
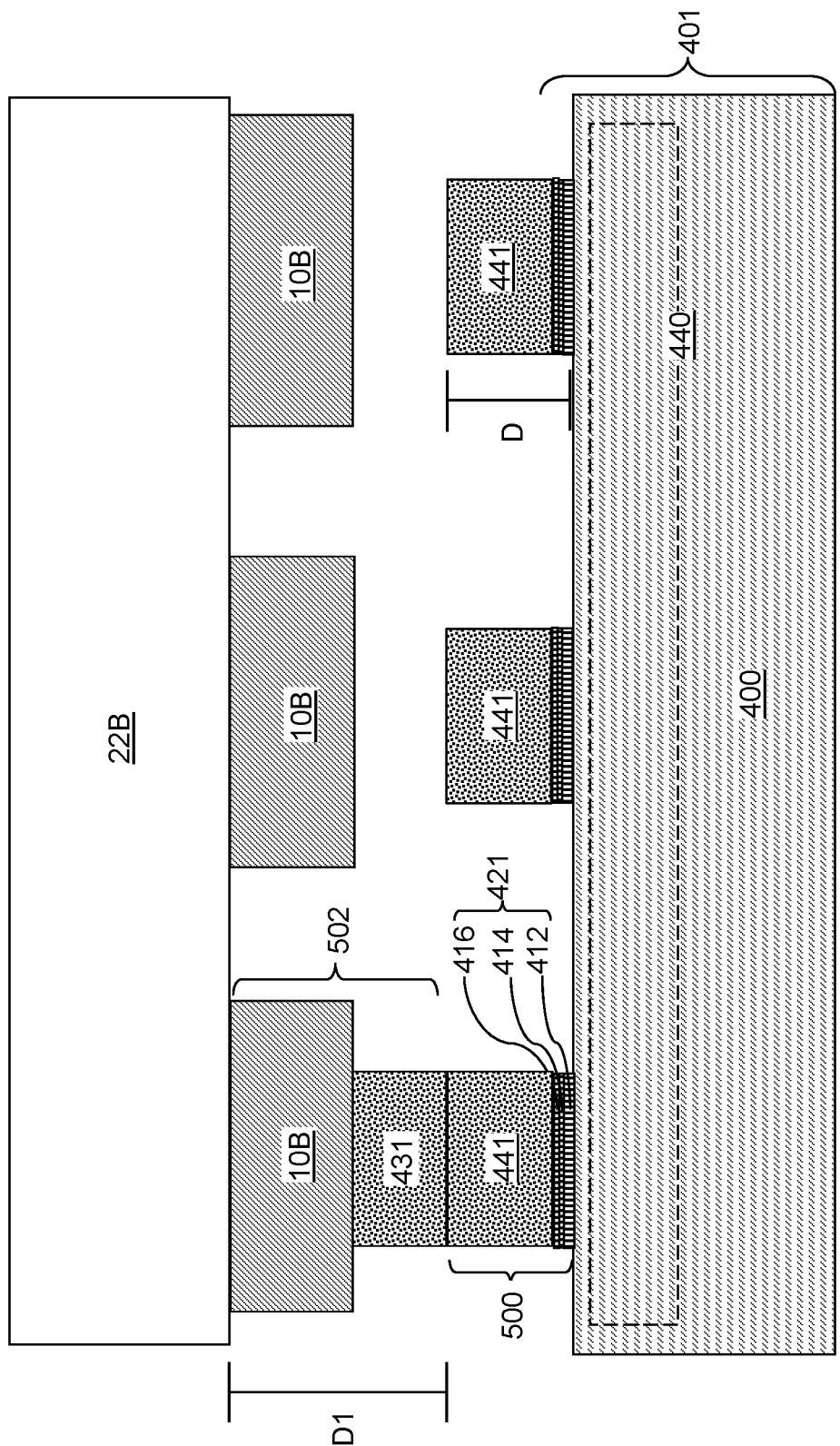
FIGS. 13A-13I are sequential vertical cross-sectional views of an exemplary structure during transfer of light emitting devices to a backplane, according to various embodiments of the present disclosure.

FIGS. 13A-13I illustrate an exemplary transfer process that can be employed to transfer LEDs from coupons to the backplane 401 illustrated in FIGS. 10B and 10C. Referring to FIG. 13A, an in-process structure is illustrated, which can be employed to form an exemplary light emitting device assembly (e.g., direct view display) according to an embodiment of the present disclosure.

In this embodiment, the backplane substrate 400 may have a substantially planar top surface. Bonding pads 421 are provided on the top surface of the backplane substrate 400. A backplane tin portion 441, which may be referred to as a "solder layer", can be provided on each of the backplane-side bonding pads 421 to form backplane bonding structures 500, employing the methods illustrated in FIGS. 10A and 10B. The bonding structures 500 may extend from the substrate 400 by a distance D (e.g., the bonding structures may have substantially the same height). The bonding structures 500 arranged in pixel regions 400P corresponding to pixels of a display device as shown in FIG. 10C, with one bonding structure 500 located in each subpixel region 400S of each pixel region 400P.

A first coupon 22B may be provided that includes an array of first LEDs 10B emitting a first color light (e.g., blue light). The first coupon 22B may be processed to apply a solder layer 431 to one or more LEDs 10B (e.g., "a first subset of the LEDs 10B") which will be bonded to the backplane 401 first, thereby forming one or more first transfer structures 502 each of which includes a LED 10B and the solder layer 431 on the LED 10B. For example, the solder layer 431 may be added to one LED 10B in each pixel region 22P of the first coupon 22B as described above. The first transfer structures 502 may extend from the surface of the first the coupon 22B by a first distance D1 (e.g., may have a thickness or height equal to distance D1). In one embodiment, the solder layer 431 may be omitted from the remaining LEDs 10B that are not included in the first subset of the LEDs 10B, as shown in FIG. 13A.

The first coupon 22B may be positioned relative to the backplane 401, such that corresponding bonding structure 500 and first transfer structure 502 are vertically aligned. For example, the respective solder layers 431, 441 may physically contact each other.

Figure 13B:
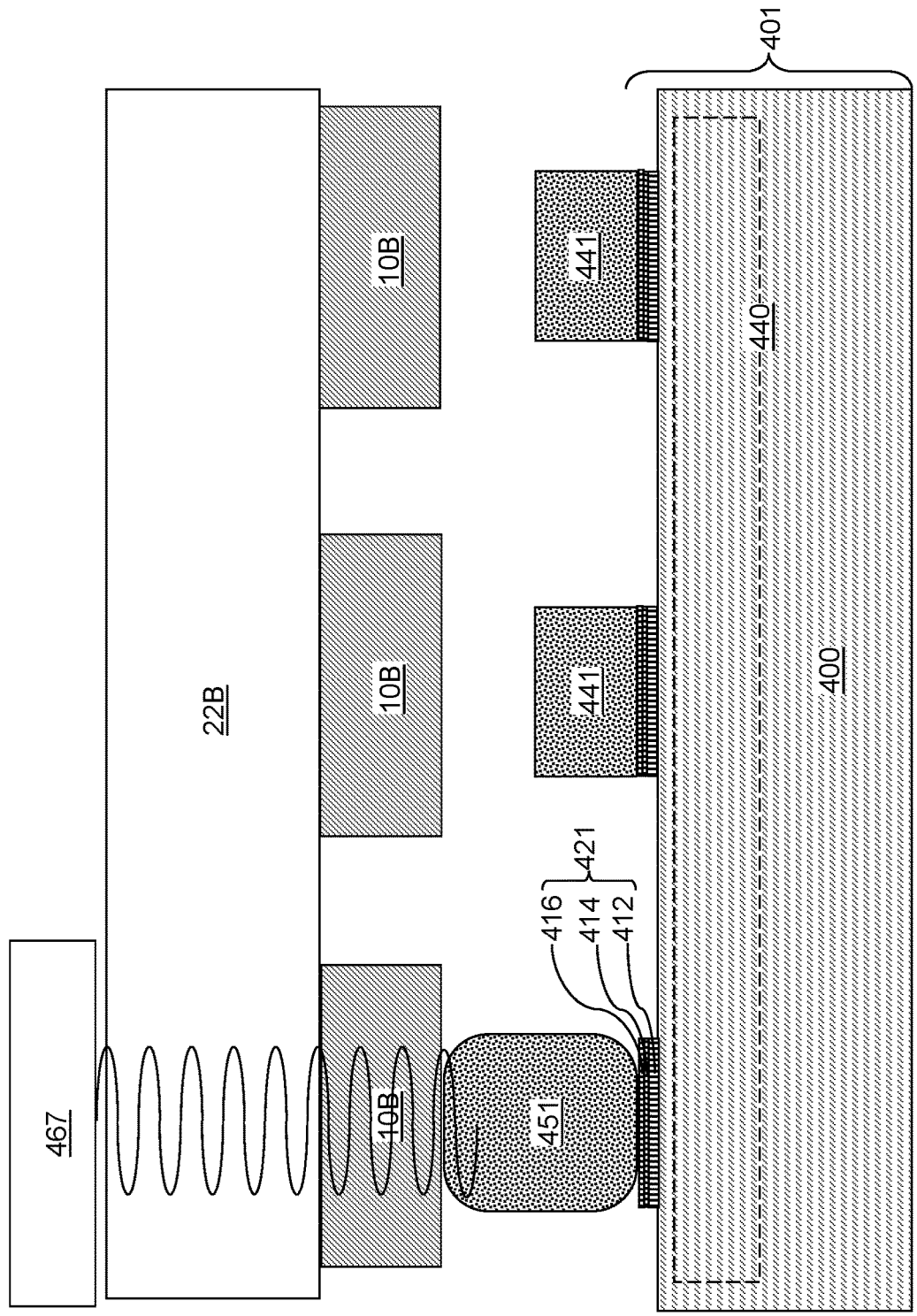

Referring to FIG. 13B, a heating laser 467 can be employed to reflow selected opposing pairs of a solder layer 431 and a backplane solder layer 441. The heating laser 467 can have a wavelength that induces greater absorption of energy within the materials of the irradiated pairs of solder layers 431, 441 than within the materials of the first coupon 22B or within the materials of the devices to be transferred (e.g., LEDs 10B). The heating laser 467 can have a wavelength in a range from 0.8 micron to 20 microns, such as 1 to 2 microns.

In one embodiment, the laser beam may be transmitted through the first coupon 22B and irradiate the reflector material layer 70 of an irradiated first light emitting diode 10B, which absorbs the laser beam and heats the adjacent solder layers 431, 441. This selective heating results in solder reflow and the formation of a soldered contact 451.

Alternatively, the heating laser 467 may be radiated on the assembly through backplane 401. A laser beam from the heating laser 467 propagates through the backplane 401 onto the backside of a selected backplane-side bonding pad 421, and heat and reflow the solder layers 441 and the underlying tin portion 431 to form the contact 451.

The backplane driver circuitry 440 (including the metal interconnect structures embedded in the backplane substrate 400) can be configured to provide openings over each backplane-side bonding pad 421, so that collateral heating of the metal interconnect structures inside the backplane substrate 400 can be minimized.

A soldered contact 451 may be formed from the reflowed materials of each heated and reflowed pair of solder layers 431, 441, from either method of laser irradiation. A third metallic bonding pad layer 86 and a third backplane-side bonding pad layer 416 that are bonded to the soldered contact 451 provide adhesion between the backplane substrate 400 and each bonded first light emitting diode 10B.

The duration of the laser irradiation that induces the reflow can be less than 1 second, and may be less than 0.1 second, and/or less than 0.01 second, and/or less than 0.001 second. Thus, the irradiation process functions as a flash anneal. Such a short reflow time is generally insufficient for intermetallic formation. The soldered contact 451 can provide good adhesion without formation of complex intermetallic compounds in the solder material, which prevents formation of composition gradients of constituent metals within the center region of each contact 451. The center region (occupying more than 99% in volume) of each contact 451 can consist of tin (i.e., pure tin with unavoidable impurities) or tin containing 0.5 atomic percent or less of silver and/or copper as an anti-dendrite agent. Each contact 451 can be relatively thin (e.g., 10 microns or less in thickness, such as 3 to 7 microns in thickness) due to its purity and provide a good planarity due to its softness.

Figure 13C:
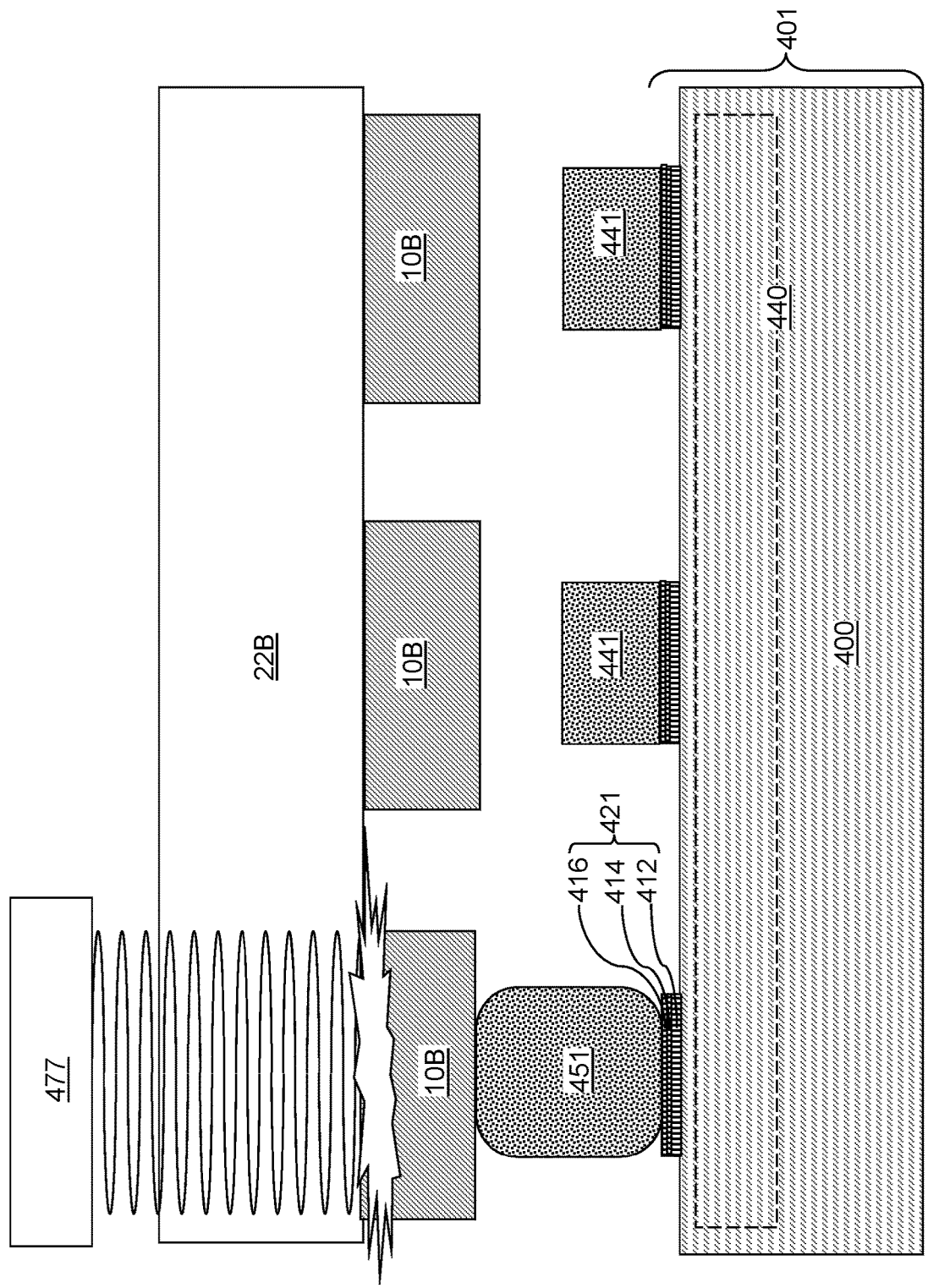

Referring to FIG. 13C, a laser irradiation process is performed to separate each bonded LED 10B from the first coupon 22B. The wavelength of the laser 477 (which is herein referred to an "ablation laser") can be different (e.g., shorter) from the wavelength of the heating laser 467, for example between 0.1 and 0.75 micron, such as 0.25 to 0.5 micron. The single crystalline buffer semiconductor layer 24 absorbs the irradiation within such a wavelength range. Thus, the material of the single crystalline buffer semiconductor layer 24 is ablated upon laser irradiation, and remaining portions of the underlying LED 10B is disconnected from the first coupon 22B. A surface of an n-doped compound semiconductor substrate layer 26 is physically exposed within the remaining portion of each irradiated LED 10B. Within each irradiated LED 10B, the single crystalline buffer semiconductor layer 24 may be completely removed, or a remaining portion of the single crystalline buffer semiconductor layer 24 may include an opening through which the surface of an underlying n-doped compound semiconductor substrate layer 26 is physically exposed.

In an alternative embodiment, the order of steps shown in FIGS. 13B and 13C may be reversed. In this alternative embodiment, the laser lift off step shown in FIG. 13C may be performed first, followed by the laser bonding step shown in FIG. 13B.

Figure 13D:
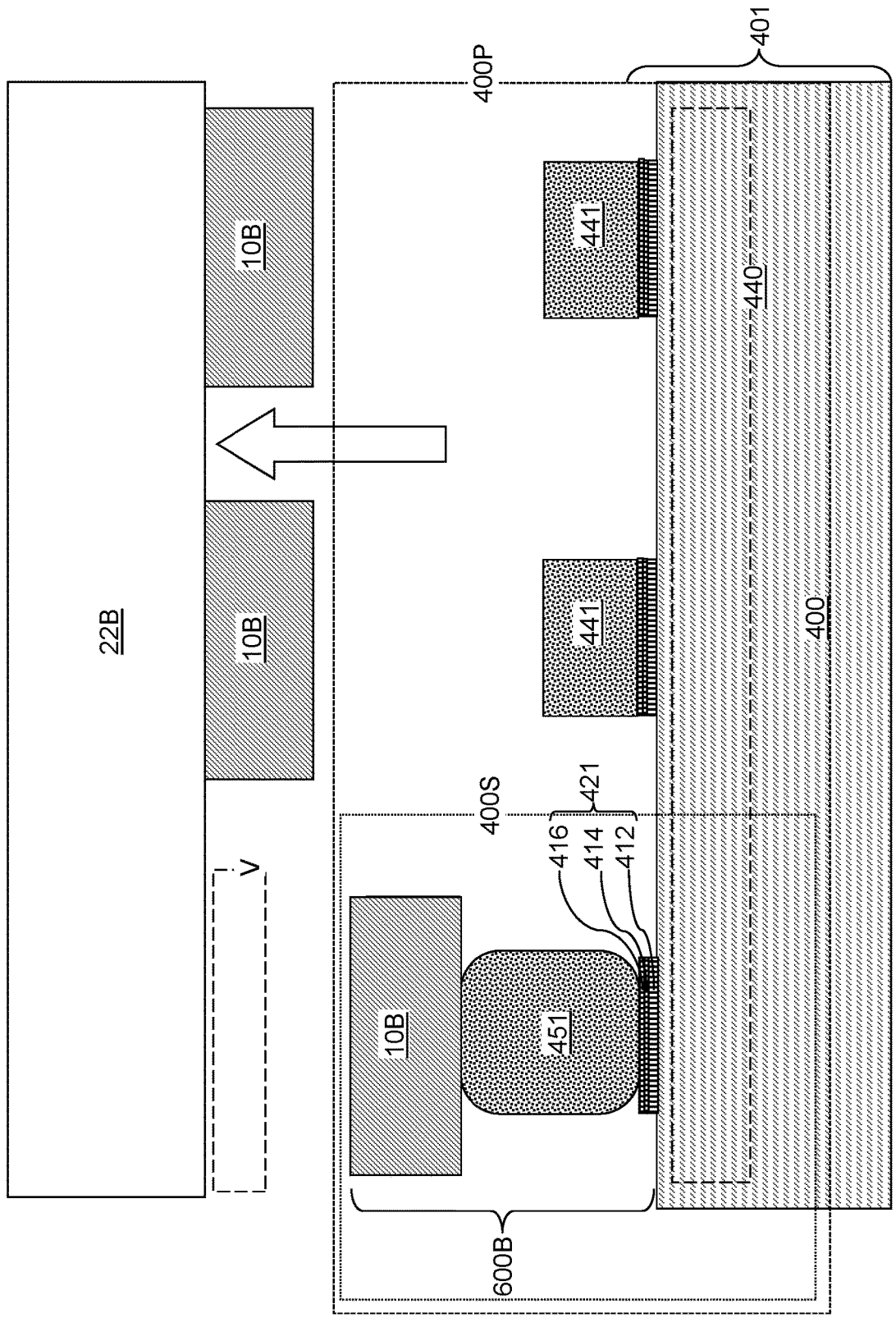

Referring to FIG. 13D, the first coupon 22B may be separated from the backplane 401, such that the bonded first subset of LEDs 10B remains on the backplane 401 to form first subpixels 600B, and a remainder of the LEDs 10B remain attached to the first coupon 22B. Accordingly, vacancies V are formed on the first coupon 22B due to the transfer of the first subset of LEDs 10B. The areas of the pixel region 400P and the subpixel regions 400S are schematically shown in dashed lines in FIG. 13D. It should be noted that the solder layers 441 may be located in two dimensions (e.g., in a rectangular layout shown in FIG. 10C) rather than all in one line as schematically shown in FIG. 13D for ease of illustration.

Figure 13E:
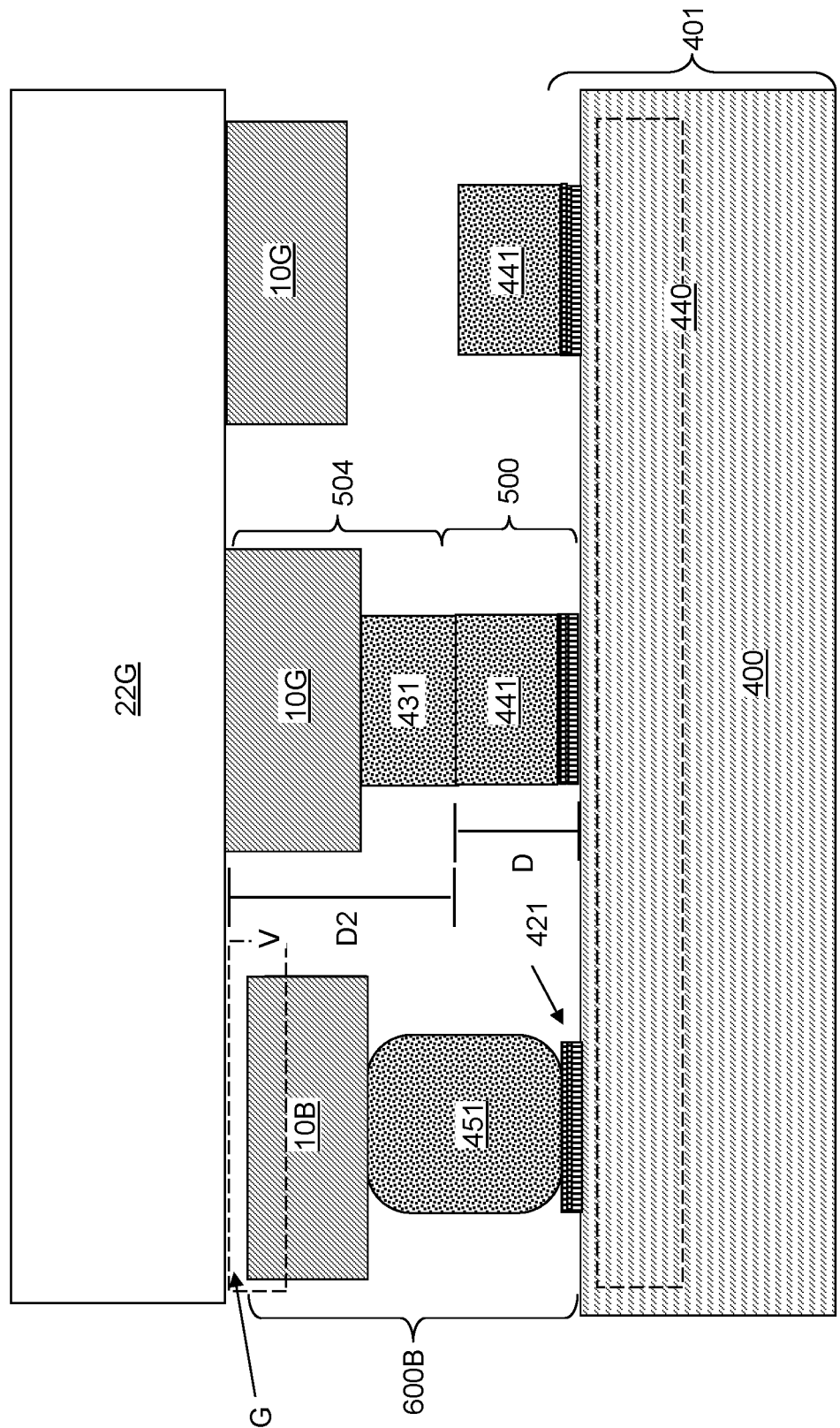

Referring to FIG. 13E, a second coupon 22G including second LEDs 10G may be provided. The second LEDs 10G may emit a second color light (e.g., green light) that is different from the first color light (e.g., blue light) emitted by the first LEDs 10B.

The second coupon 22G can initially include a full array of LEDs 10G. The processing steps of FIGS. 13A-13D can be performed to transfer a first subset of the LEDs 10G to another backplane (not shown), such that vacancies V are formed on the second coupon 22G. The vacancies may be arranged in a pattern that corresponds to a pattern formed on the backplane 401 by the transferred first LEDs 10B.

The second coupon 22G may be processed such that after the first subset of the LEDs 10G is bonded to another backplane, an electrically conductive material is formed on a second subset of the LEDs 10G to form second transfer structures 504. The second transfer structures 504 have a thicker electrically conductive material than the respective electrically conductive material of the first transfer structures 502, such that the second transfer structures 504 have a total thickness that is greater than the total thickness of the first transfer structures 502.

The electrically conductive material may comprise at least one of the reflective material layer which forms the reflector 70, the solder layer 431 or a combination thereof. For example, if the semiconductor layers of the first LEDs 10B have the same thickness as the respective semiconductor layers of the second LEDs 10B, then the combination of the reflector 70 and the solder layer 431 in the second transfer structures 504 has a greater thickness than the combination of the reflector 70 and the solder layer 431 in the first transfer structures 502.

Figure 14A:
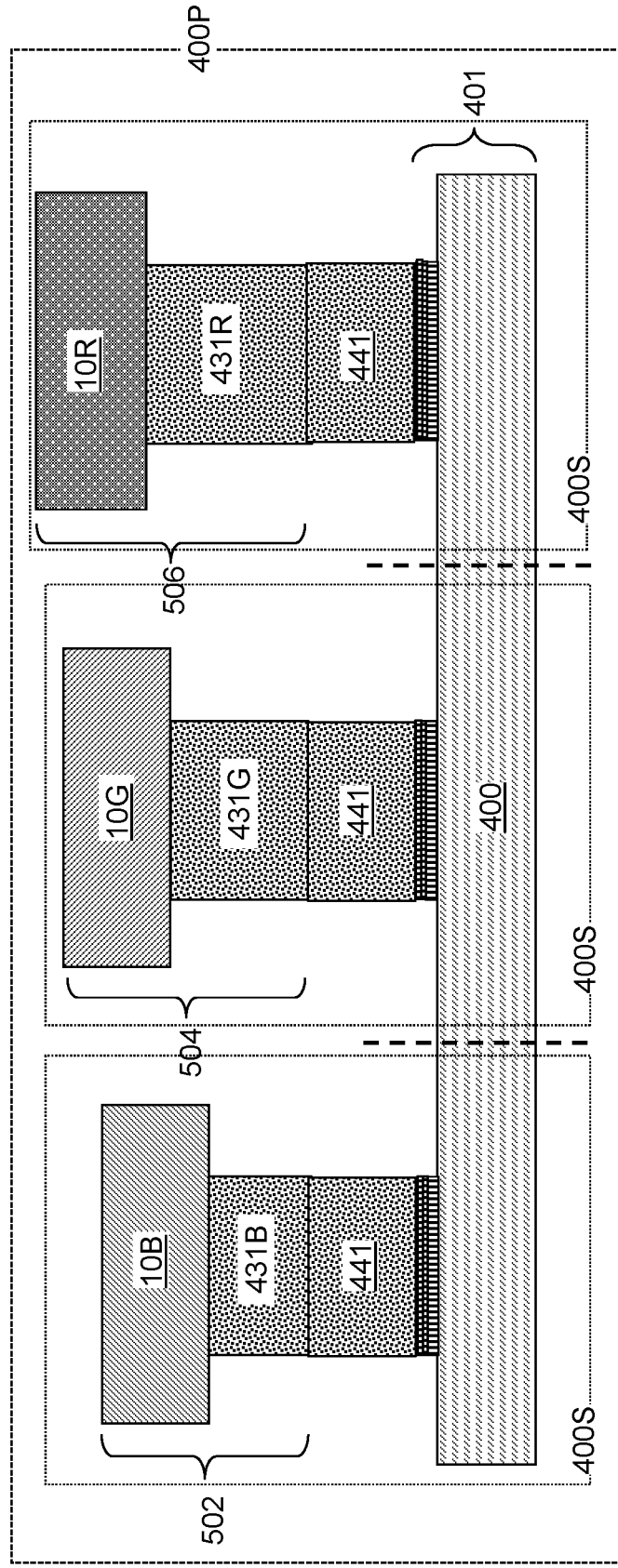
FIGS. 14A and 14B are sectional views of display devices, according to various embodiments of the present disclosure.

In a first embodiment shown in FIGS. 13E and 14A, the first and the second transfer structures have the same thickness respective semiconductor layers and reflectors 70, but the second solder layer 431 (e.g., 431G in FIG. 14A) of the second transfer structure 504 is thicker than the first solder layer 431 (e.g., 431B in FIG. 14A) of the first transfer structure 502. In a second embodiment shown in FIG. 14B and described in more detail below, the first and the second transfer structures have the same thickness respective semiconductor layers and solder layers 431 but the second reflector 70 (e.g., 70G in FIG. 14B) of the second transfer structure 504 is thicker than the first reflector 70 (e.g., 70B in FIG. 14B) of the first transfer structure 502. In a third embodiment, the first and the second transfer structures have the same thickness respective semiconductor layers, but both the reflector 70 and the solder layer 431 of the second transfer structure 504 are thicker than the respective reflector 70 and the solder layer 431 of the first transfer structure 502

As shown in FIG. 13E, in the first embodiment, the second solder layer 431 (i.e., 431G) of the second transfer structure 504 is thicker than the first solder layer 431 (i.e., 431B) of the first transfer structure 502. The second solder layer 431 may be deposited as a single layer in one step on the second subset of the LEDs 10G after the first subset of the LEDs 10G is bonded to another backplane to form at least one second transfer structure 504. Alternatively, the second solder layer 431 may be deposited in two separate steps. For example, the same thickness second solder layer 431 is deposited on both the first and the second subsets of LEDs 10G, followed by bonding the first subset of the LEDs 10G to another backplane, followed by forming a second portion of the second solder layer 431 on the previously deposited first portion of the second solder layer 431 located on the second subset of the LEDs 10G to form at least one second transfer structure 504.

As shown in FIG. 13E, the second transfer structures 504 may extend from the surface of the second coupon 22G by a distance D2 (e.g., have a thickness or height equal to distance D2) that is greater than the distance D1 the first transfer structures 502 extended from the first coupon 22B at the step shown in FIG. 13A. For example, distance D2 may be from about 1 µm to about 5 µm, such as from about 1.25 µm to about 3 µm, or from about 1.5 µm to about 2 µm greater than distance D1.

The second coupon 22G may be positioned over the backplane 401, such that the first subpixels 600B are disposed within the vacancies (V) formed by the removal of the first subset of LEDs 10G from the second coupon 22G. In addition, a combined height (D+D2) of the bonding structures 500 and second transfer structures 504 may be greater than a height of the first subpixel 600B, such that a gap G is formed between the first LED 10B of each first subpixel 600B and the second coupon 22G. As such, the first subpixels 600B do not physically interfere with the placement of the second subset of LEDs 10G.

Figure 13F:
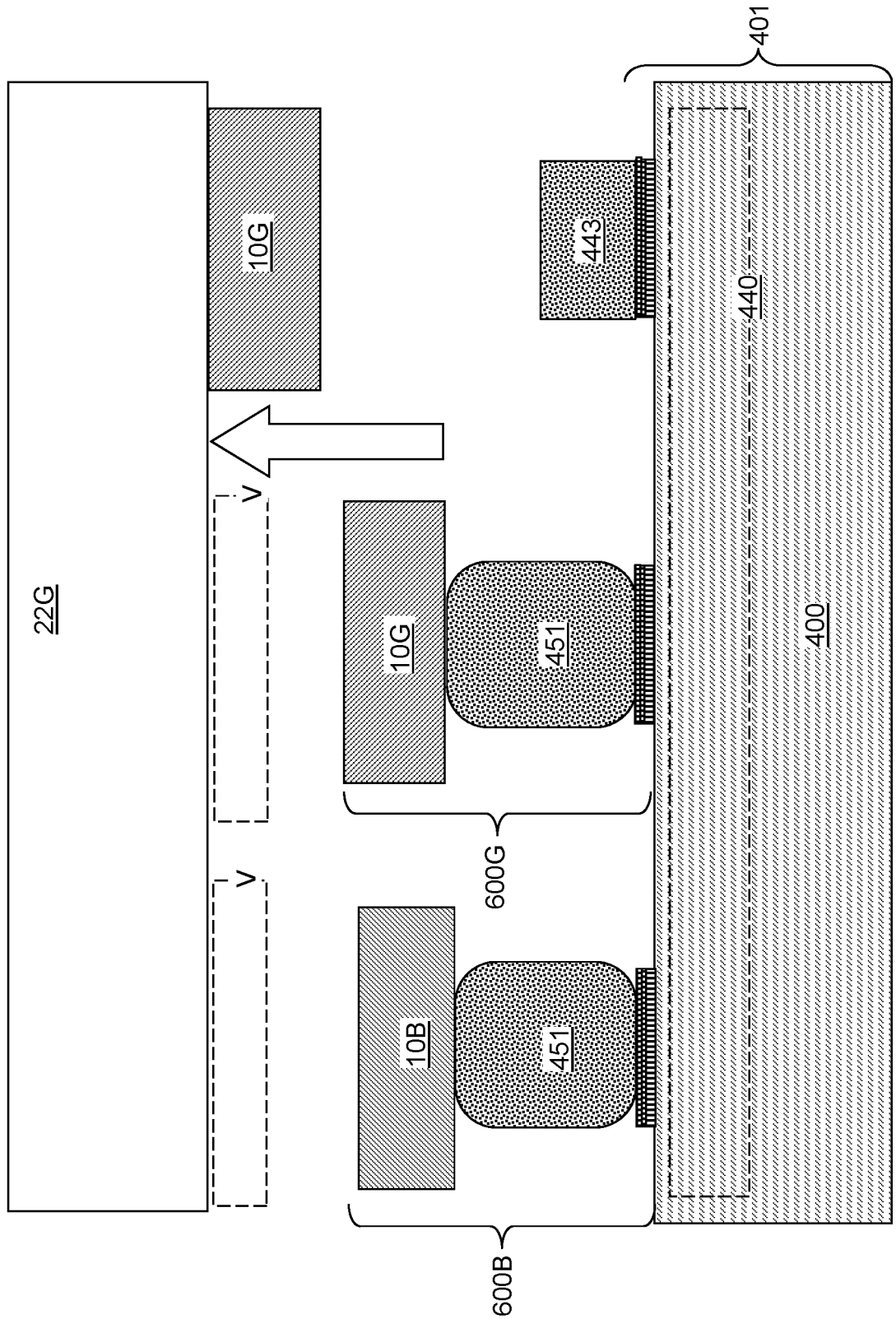

The laser irradiation and ablation methods of FIGS. 13B and 13D can be employed to bond the second subset of LEDs 10G to the backplane 401 and detach the second subset of LEDs 10G from the second coupon 22G. Accordingly, as shown in FIG. 13F, second subpixels 600G may be formed on the backplane 401 and the second coupon 22G may be removed.

Figure 13G:
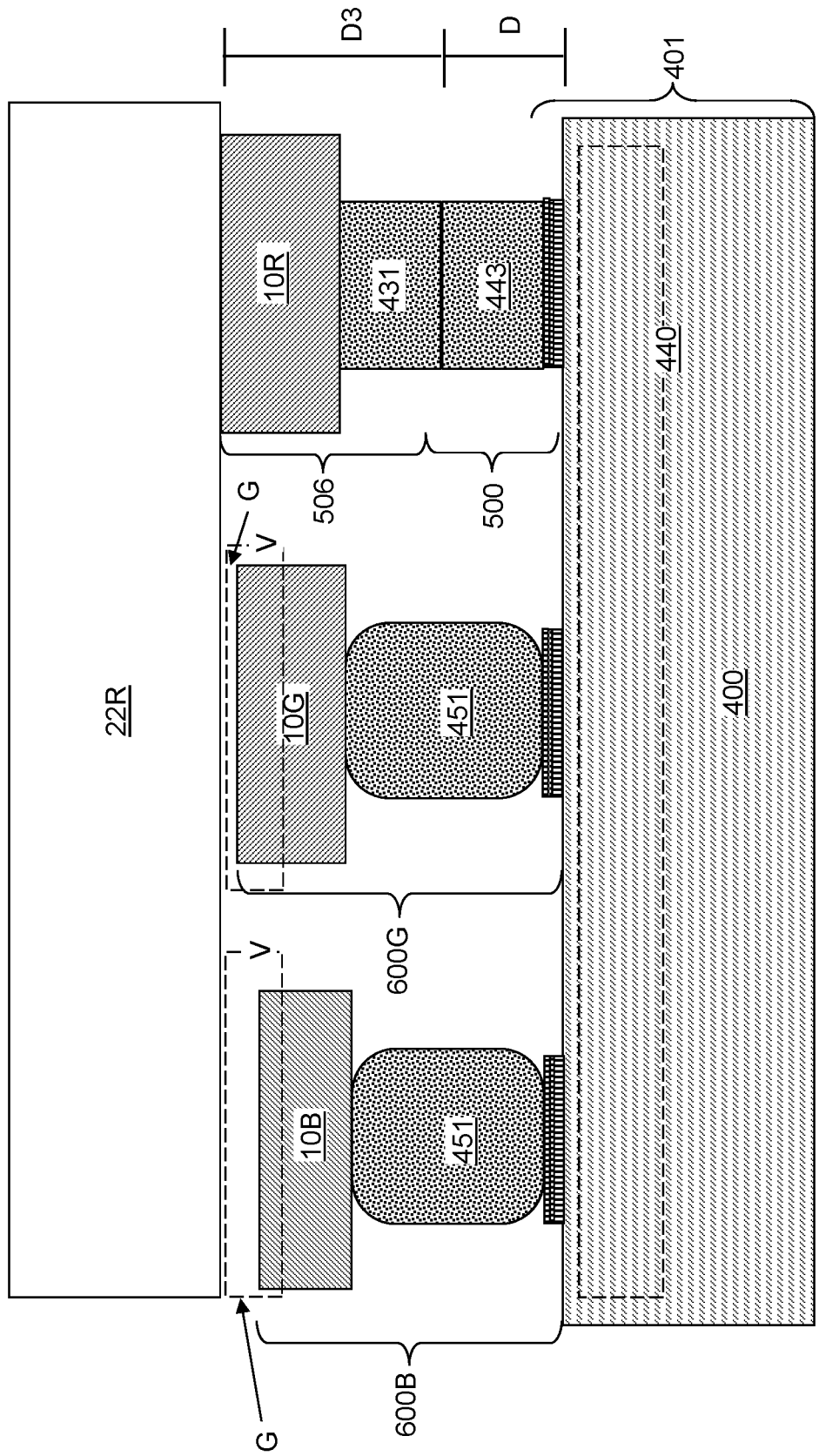

Referring to FIG. 13G, a third coupon 22R including third LEDs 10R may be provided. The third LEDs 10R may emit a third color light (e.g., red light) that is different from the first color light (e.g., blue light) emitted by the first LEDs 10B and the second color light (e.g., green light) emitted by the second LEDs 10G.

The third coupon 22R can initially include a full array of third LEDs 10R. The processing steps of FIGS. 13A-13D can be performed to transfer first and second subsets of the LEDs 10R to other backplanes (not shown), such that vacancies V are formed on the third coupon 22R. The vacancies may be arranged in a pattern that corresponds to a pattern formed on the backplane 401 by the transferred LEDs 10B and 10G of the first and second respective subpixels (600B, 600G).

The third coupon 22R may be processed such that after the first and second subsets of the LEDs 10R are bonded to other backplanes, an electrically conductive material is formed on a third subset of the LEDs 10R to form third transfer structures 506. The third transfer structures 506 have a thicker electrically conductive material than the respective electrically conductive material of the first and second transfer structures (502, 504), such that the third transfer structures 506 have a total thickness that is greater than the total thickness of the first transfer structures 502 and the second transfer structures 504.

The electrically conductive material may comprise at least one of the reflective material layer which forms the reflector 70, the solder layer 431 or a combination thereof. For example, if the semiconductor layers of the first and second LEDs (10B, 10G) have the same thickness as the respective semiconductor layers of the third LEDs 10R, then the combination of the reflector 70 and the solder layer 431 in the third transfer structures 506 has a greater thickness than the combination of the reflector 70 and the solder layer 431 in either the first transfer structures 502 or the second transfer structures 504.

In a first embodiment shown in FIGS. 13G and 14A, the first, second and third transfer structures have the same thickness respective semiconductor layers and reflectors 70, but the third solder layer 431 (i.e., 431R) of the third transfer structure 506 is thicker than the first and second solder layers 431 (i.e., 431B and 431G) of each of the first transfer structure 502 and the second transfer structure 504. In a second embodiment shown in FIG. 14B and described in more detail below, the first, second and third transfer structures have the same thickness respective semiconductor layers and solder layers 431, but the third reflector 70R of the third transfer structure 506 is thicker than the first and second reflectors (70B, 70G) of each of the first transfer structure 502 and the second transfer structure 504. In a third embodiment, the first, second and third transfer structures have the same thickness respective semiconductor layers, but both the reflector 70 and the solder layer 431 of the third transfer structure 506 are thicker than either the respective reflector 70 and the solder layer 431 of the first transfer structure 502 or the second transfer structure 504.

In the first embodiment, the third solder layer 431R of the third transfer structure 506 is thicker than the first and second solder layers (431B, 431G) of the first transfer structure 502 and the second transfer structure 504. As described above with respect to FIG. 13E, the third solder layer 431 may be deposited as a single layer in one step or in plural steps on the third subset of the LEDs 10R after the first and second subsets of the LEDs 10R are bonded to other backplanes to form at least one third transfer structure 506.

The third transfer structures 506 may extend from the surface of the third coupon 22R by a distance D3 (e.g., may have a thickness or height equal to distance D3) that is greater than the distance D2 by which the second transfer structures 504 extend. For example, distance D3 may be from about 1 μm to about 5 μm, such as from about 1.25 μm to about 3 μm, or from about 1.5 μm to about 2 μm greater than distance D2.

As shown in FIG. 13G, the third coupon 22R may be positioned over the backplane 401, such that the first and second subpixels 600B, 600G are disposed within the vacancies (V) formed by the removal of the first and second subsets of LEDs 10R from the third coupon 22R. In addition, a combined thickness or height (D+D3) of the bonding structures 500 and the third transfer structures 506 may be greater than the heights of the first and second subpixels 600B, 600G, such that gaps G are formed between the LEDs 10B, 10G of the first and second subpixels 600B, 600G, and the third coupon 22R. As such, the first and second subpixels 600B, 600G do not physically interfere with the placement of the third subset of LEDs 10R.

Figure 13H:
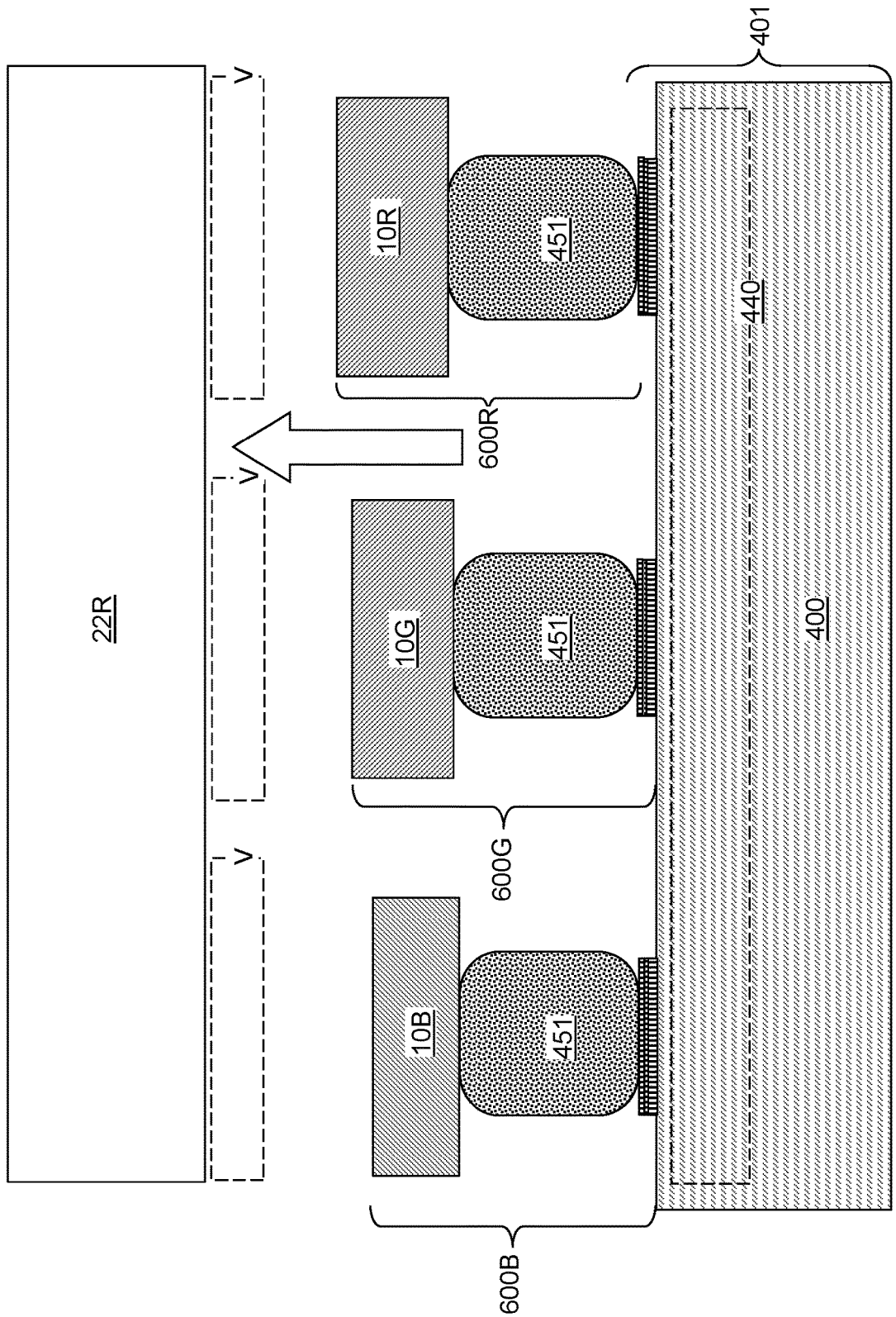

The laser irradiation and ablation methods of FIGS. 13B and 13D can be employed to bond the third subset of LEDs 10R to the backplane 401 and detach the third subset of LEDs 10R from the third coupon 22R. Accordingly, as shown in FIG. 13H, third subpixels 600R may be formed on the backplane 401 and the third coupon 22R may be removed. Thus, three different color LEDs (10B, 10G, 10R) may be sequentially bonded to the backplane substrate 401 in the respective subpixel regions 400S of the same pixel region 400P.

Figure 13I:
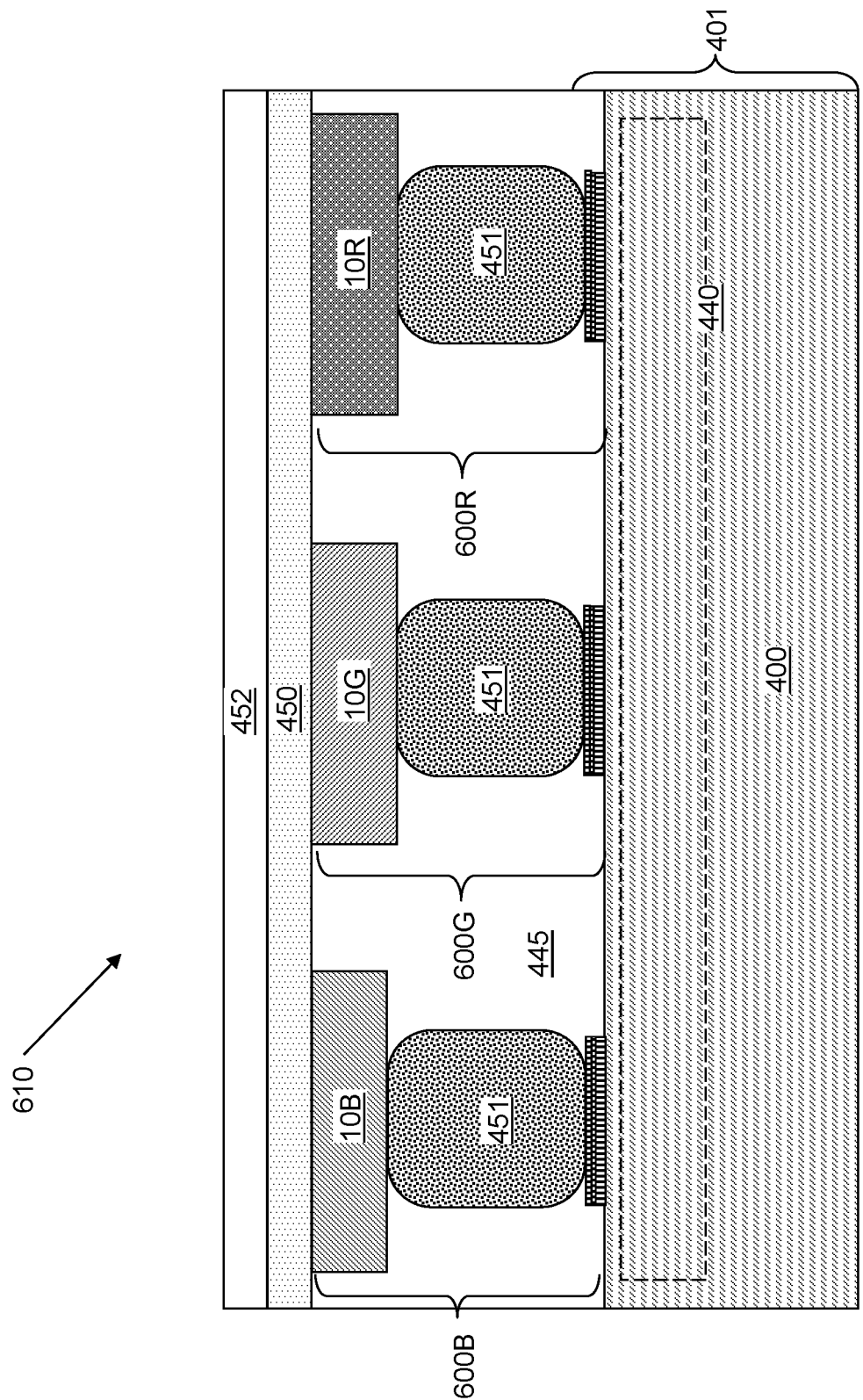

Referring to FIG. 13I, a display device 610 may be formed by disposing a dielectric matrix 445 on the backplane 401 between the subpixels 600B, 600G, 600R. The dielectric matrix 445 can laterally surround each of the subpixels 600B, 600G, 600R that constitute the array of pixels over the backplane 401. The dielectric matrix 445 can include a self-planarizing dielectric material such as spin-on glass (SOG) or polymer, or can be planarized by a recess etch or chemical mechanical planarization. The top surface of the dielectric matrix 445 as planarized can be within the horizontal plane including the top surfaces of the transferred LEDs 10B, 10G, 10R, or can be vertically recessed below the horizontal plane including the top surfaces of the LEDs 10B, 10G, 10R. In one embodiment, the dielectric matrix 445 may be patterned to physically expose a conductive pad structure on the backplane substrate 400.

A front side transparent conductive oxide layer 450 can be formed over the dielectric matrix 445 and directly on the electrical nodes that are located on top of each LED 10B, 10G, 10R. For example, the front side transparent conductive oxide layer 450 can be deposited on the compound semiconductor material layer 26 of each LED 10B, 10G, 10R and the physically exposed conductive pad structure (not shown) located on the backplane substrate 400, thereby providing a common electrical ground for the transferred light emitting diodes (10B, 10G, 10R). Alternatively, if the single crystalline buffer semiconductor layer 24 has a high resistivity and is not completely removed during the laser ablation step described above, additional n-type dopants can be introduced into the single crystalline buffer semiconductor layer 24 to provide sufficiently high conductivity, and the n-doped single crystalline buffer semiconductor layer 24 can be employed as a conductive path to the front side transparent conductive oxide layer 450.

An optional transparent passivation dielectric layer 452 can be formed over the front side transparent conductive oxide layer 450. The transparent passivation dielectric layer 452 can include silicon nitride or silicon oxide. Thus, the LEDs 10B, 10G, 10R can emit light through the n-doped compound semiconductor substrate layer 26, the front side transparent conductive oxide layer 450 and the transparent passivation dielectric layer 452. The light emitting diodes are vertical devices because they have electrical contacts on opposite sides, i.e., one electrical contact at top and another electrical contact at bottom.

Multiple transfer assemblies and multiple backplanes can be employed to transfer devices of different types to each backplane, and to form a periodic array of a device set on each backplane. The devices in each transfer assembly can have the same two-dimensional periodicity prior to a series of device transfers. The periodic array of a device can be the same across the backplanes, and can have a two-dimensional periodicity that is multiples of the two-dimensional periodicity of the devices on the transfer assemblies.

FIG. 14A illustrates the display device of the first embodiment containing different thickness first, second, and third solder layers 431B, 431G, 431R made by the process of FIGS. 13A to 13I. In particular, the second solder layer 431G may be thicker than the first solder layer 431B, and the third solder layer 431R may be thicker than the second solder layer 431G. Therefore, the height differential between the transfer structures 502, 504, 506 may be provided by varying the thickness of the solder layers 431B, 431G, 431R.

Figure 14B:
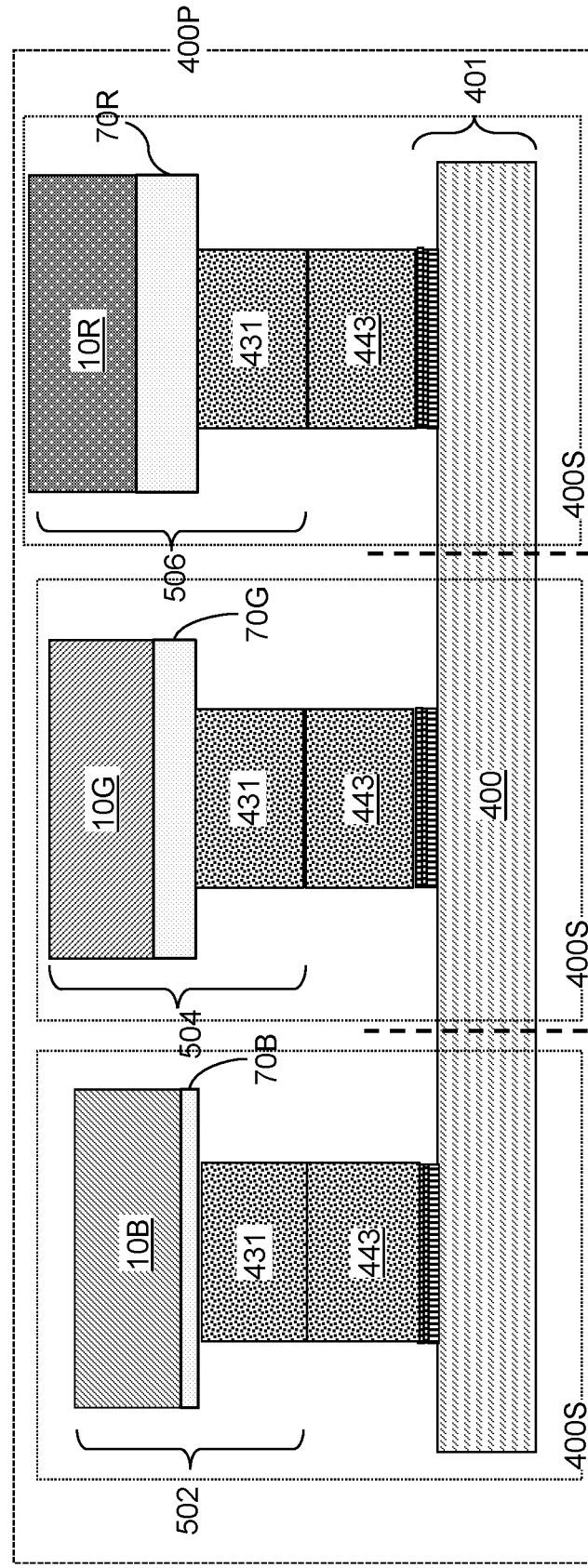

FIG. 14B illustrates the display device of the second embodiment containing different thickness first, second, and third reflectors 70B, 70G, 70R made by the process of FIGS. 13A to 13I. Referring to FIGS. 13A-13I, and 14B, the processing of the coupons 22B, 22G, 22R may include depositing different thickness reflective layers to respectively form first, second, and third reflectors 70B, 70G, 70R of the LEDs 10B, 10G, 10R. In particular, a thicker reflective layer may be deposited on the second LEDs 10G than on the first LEDs 10B, to form the second reflectors 70G, and a thicker reflective layer may be deposited on the third LEDs 10R than on the second LEDs 10G, to form the third reflectors 70R. As such, the second reflector 70G may be thicker than the first reflector 70B, and the third reflector 70R may be thicker than the second reflector 70G.

The second and third reflectors (70G, 70R) may be deposited in a single deposition step or in plural deposition steps at the process steps shown in FIGS. 13E and/or 13G. For example, the second and/or the third reflectors (70G, 70R) may be deposited as a single layer in one step on the second subset of the LEDs 10G or the third subset of LEDs 10R, respectively, after the first subset of the LEDs 10G and/or the first and second subsets of the LEDs 10R are bonded to other backplane. Alternatively, the second and/or the third reflectors (70G, 70R) may each be deposited in two separate steps. For example, the same thickness second reflective layers are deposited on both the first and the second subsets of LEDs 10G, followed by bonding the first subset of the LEDs 10G to another backplane, followed by forming a second portion of the second reflective layer on the previously deposited first portion of the second reflective layer located on the second subset of the LEDs 10G to form the second reflector 70G of at least one second transfer structure 504. Similar multistep deposition process may be carried out for the third reflector 70R.

In the second embodiment, solder may be deposited on each of the LEDs 10B, 10G, 10R after forming the reflectors 70B, 70G, 70R, such that the solder layers 431 have substantially the same thickness or height. Therefore, the height differential between the transfer structures 502, 504, 506 may be provided by varying the thickness of the reflectors 70B, 70G, 70R.

In the third embodiment, solder may be deposited on each of the LEDs 10B, 10G, 10R after forming the reflectors 70B, 70G, 70R, such that the solder layers 431B, 431G, 431R have different thicknesses. Therefore, the height differential between the transfer structures 502, 504, 506 may be provided by varying the thickness of both the reflectors 70B, 70G, 70R and the solder layers 431B, 431G, 431R.

In summary, as described above with respect to FIGS. 10A to 14B, a method of transferring light emitting diodes (LEDs) comprises providing first LEDs 10B configured to emit first color light and located on a first substrate 22B, as shown in FIGS. 12 and 13A, and second LEDs 10G configured to emit second color light different from the first color light and located on a second substrate 22G, as shown in FIGS. 12 and 13E. The method also includes transferring a first subset of the first LEDs 10B to a first subset of bonding structures 500 on a first backplane 401 to form first subpixels 600B in pixel regions 400P and separating the first subset of the first LEDs 10 from the first substrate 22B, as shown in FIG. 13D. The method also includes transferring a first subset of the second LEDs 10G to a second backplane and separating the first subset of the second LEDs 10G from the second substrate 22G to leave first vacancies V on the second substrate 22G, and forming an additional electrically conductive material (70 and/or 431) on a second subset of second LEDs 10G located on the second substrate 22G after transferring the first subset of the second LEDs 10G to the second backplane, as shown in FIG. 13E. The method also includes positioning the second substrate 22G over the first backplane 401, such that the first subpixels 600B are disposed in the first vacancies (V), and transferring the second subset of the second LEDs 10G to a second subset of bonding structures 500 on the first backplane 401 to form second subpixels 600G in the pixel regions 400P, while a gap (G) exists between the first subpixels 600B and the second substrate 22G due to the presence of the additional electrically conductive material, as shown in FIGS. 13E and 13F.

In one embodiment, the step of transferring the first subset of the first LEDs 10B to the first subset of bonding structures 500 comprises forming a first solder layer 431 on the first subset of the first LEDs 10B, bonding the first solder layer to the first bonding structures, and separating the first subset of the first LEDs 10B from the first substrate 22B. The step of transferring the second subset of the second LEDs 10G to the second subset of bonding structures 500 comprises forming a second solder layer 431 on the second subset of the second LEDs 10G, bonding the second solder layer to the second bonding structures, and separating the second subset of the second LEDs 10G from the second substrate 22G.

In one embodiment, bonding the first solder layer to the first bonding structures comprises a first laser bonding step, as shown in FIG. 13B, separating the first subset of the first LEDs 10B from the first substrate 22B comprises a first laser lift off step, as shown in FIG. 13C, bonding the second solder layer to the second bonding structures comprises a second laser bonding step, and separating the second subset of the second LEDs 10G from the second substrate 22G comprises a second laser lift off step.

In one embodiment, the first solder layer 431 on the first subset of the first LEDs 10B comprise first transfer structures 502, as shown in FIG. 13A. The second solder layer 431 on the second subset of the second LEDs 10G comprise second transfer structures 504, as shown in FIG. 13E. The first transfer structures 502 extend from the first substrate 22B by a first distance D1, and the second transfer structures 504 extend from the second substrate 22G by a second distance D2 that is greater than the first distance D1.

In the first embodiment, the step of forming the additional electrically conductive material comprises forming the second solder layer 431G which is thicker than the first solder layer 431B, as shown in FIG. 14A. In the second embodiment, the step of forming the additional electrically conductive material comprises forming a second reflective layer 70G on the second subset of second LEDs 22G which is thicker than a first reflective layer 70B on the first subset of first LEDs 22B, as shown in FIG. 14B. The second reflective layer (i.e., reflector) 70G may be formed by forming a first portion of the second reflective layer 70G on both the first and the second subsets of the second LEDs 22G prior to transferring the first subset of the second LEDs 22G to the second backplane, and forming a second portion of the second reflective layer 70G on the first portion of the second reflective layer located on the second subset of the second LEDs after transferring the first subset of the second LEDs to the second backplane. In the third embodiment, forming the additional electrically conductive material comprises forming the second solder layer 431G which is thicker than the first solder layer 431B and forming a second reflective layer 70G on the second subset of second LEDs 10G which is thicker than a first reflective layer 70B on the first subset of first LEDs 10B.

In one embodiment, the method also includes providing third LEDs 10R configured to emit third color light different from the first and second color light and located on a third substrate 22R, transferring first and second subsets of the third LEDs 10R to additional backplanes and separating the first and second subsets of the third LEDs 10R from the third substrate 22R to leave second vacancies (V) on the third substrate 22R, forming another additional electrically conductive material (70R and/or 431R) on a third subset of third LEDs 10R 10R located on the third substrate 22R after transferring the first and second subsets of the third LEDs to the additional backplanes, and positioning the third substrate 22R over the first backplane 401, such that the first and the second subpixels (600B, 600G) are disposed in the second vacancies (V), as shown in FIG. 13G. The method also includes transferring the third subset of the third LEDs 10RR to a third subset of bonding structures 500 on the first backplane 401 to form third subpixels 600R in the pixel regions 400P, while a gap (G) exists between the first and the second subpixels (600B, 600G) and the third substrate 22R due to the presence of the another additional electrically conductive material, as shown in FIG. 13H.

In one embodiment, the step of transferring the third subset of the third LEDs 10R to the third subset of bonding structures 500 comprises forming a third solder layer 431 on the third subset of the third LEDs 10R, bonding the third solder layer 431 to the third bonding structures 500, and separating the third subset of the third LEDs 10R from the third substrate 22R, as shown in FIG. 13H.

In the first embodiment, the step of forming the another additional electrically conductive material comprises forming the third solder layer 431R which is thicker than the first and the second solder layers (431B, 431G), as shown in FIG. 14A. In the second embodiment, forming the another additional electrically conductive material comprises forming a third reflective layer (e.g., third reflector) 70R on the third subset of third LEDs 10R which is thicker than a first reflective layer 70B on the first subset of first LEDs 10B and a second reflective layer 70G on the second subset of second LEDs 10G.

In one embodiment, the first substrate 22B comprises a first coupon diced from a first wafer 22 on which the first LEDs 10B are initially formed, the second substrate 22G comprises a second coupon diced from a second wafer 22 on which the second LEDs 10G are initially formed, and the third substrate 22R comprises a third coupon diced from a third wafer 22 on which the third LEDs 10R are initially formed.

In one embodiment shown in FIGS. 11A and 11C, the density of subpixels 600 (i.e., 600B, 600G, 600R) in the pixel region 400P is lower than a density of the first LEDs 10B located on the first substrate, is lower than a density of the second LEDs 10G located on the second substrate, and is lower than a density of the third LEDs 10R located on the third substrate. As shown in FIGS. 11A and 11C, the first LEDs 10 (e.g., 10B) are located on the first substrate 22 (e.g., 22B) in first pixel regions 22P, the second LEDs 10G are located on the second substrate 22 (e.g., 22G) in second pixel regions, the third LEDs 10R are located on the third substrate 22 (e.g., 22R) in third pixel regions, the first, second and third pixel regions 22P have the same area and shape as the pixel regions 400P on the first backplane 401 shown in FIG. 10C, and more LEDs 10 are disposed in each of the first, second and third pixel regions 22P than in the pixel regions 400P on the first backplane 401.

In one embodiment at least two (such as at least nine) of the first, second, or third LEDs 10 are disposed in each of the respective first, second or third pixel regions 22P as shown in FIG. 11C, and only one of each of the first, second, and third LEDs are disposed in each pixel region 400P on the first backplane 401 shown in FIG. 10C.

In one embodiment, the first, second and third bonding structures 500 extend from the first backplane 401 by substantially the same distance. The first backplane 401 may be incorporated into a direct view display device.

In one embodiment, a display device comprises a backplane 401, a first light emitting diode (LED) 10B containing a first reflector 70B and configured to emit first color light is bonded to the backplane 401, a second LED 10G containing a second reflector 70G and configured to emit second color light different from the first color light is bonded to the backplane 401, and a third LED 10R containing a third reflector 70R and configured to emit third color light different from the first and second color light is bonded to the backplane. The second reflector 70G is thicker than the first reflector 70B, and the third reflector 70R is thicker than the second reflector 70G.

In one embodiment, the display device comprises a direct view display device, the first reflector 70B comprises a first aluminum layer, the second reflector 70G comprises a second aluminum layer which is thicker than the first aluminum layer, and the third reflector 70R comprises a third aluminum layer which is thicker than the second aluminum layer.

Accordingly, various embodiments provide methods of forming LEDs on a wafer at a high density, by forming multiple LEDs within a single subpixel region on the wafer. As such, LED fabrication costs may be reduced. In addition, various embodiments provide processes whereby metal can be added to selected LEDs of arrays of different LEDs having substantially the same thickness, such that LED transfer structures of different heights (e.g., thicknesses) can be manufactured and transferred to a backplane without physical interference. Further, since LEDs of different colors are initially manufactured at a consistent thickness, the LEDs can be transferred to a backplane in any order, thereby increasing manufacturing flexibility.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

The invention claimed is:

1. A display device, comprising:
   a backplane;
   a first light emitting diode (LED) containing a first reflector and configured to emit first color light bonded to the backplane;
   a second LED containing a second reflector and configured to emit second color light different from the first color light bonded to the backplane; and
   a third LED containing a third reflector and configured to emit third color light different from the first and second color light bonded to the backplane;
   wherein the second reflector is thicker than the first reflector, and the third reflector is thicker than the second reflector, and
   wherein each of the first LED, the second LED and the third LED is provided on a planar top surface of the backplane.

2. The display device of claim 1, wherein:
   the display device comprises a direct view display device;
   the first reflector comprises a first aluminum layer;
   the second reflector comprises a second aluminum layer which is thicker than the first aluminum layer; and
   the third reflector comprises a third aluminum layer which is thicker than the second aluminum layer.

3. The display device of claim 1, further comprising:
   a first solder layer provided between the planar top surface and the first reflector;
   a second solder layer provided between the planar top surface and the second reflector; and
   a third solder layer provided between the planar top surface and the third reflector.

4. A display device, comprising:
   a backplane having a planar top surface;
   a first light emitting diode (LED) configured to emit first color light;
   a second LED configured to emit second color light different from the first color light;
   a third LED configured to emit third color light different from the first and second color light;
   a first solder layer provided between the planar top surface and the first LED;
   a second solder layer provided between the planar top surface and the second LED; and
   a third solder layer provided between the planar top surface and the third LED;
   wherein the second solder layer is thicker than the first solder layer, and the third solder layer is thicker than the second solder layer.

5. A display device, comprising:
   a backplane having a planar top surface;
   a first light emitting diode (LED) configured to emit first color light;
   a second LED configured to emit second color light different from the first color light;
   a third LED configured to emit third color light different from the first and second color light;
   a first transfer structure provided between the planar top surface and the first LED;
   a second transfer structure provided between the planar top surface and the second LED; and
   a third transfer structure provided between the planar top surface and the third LED;
   wherein the second transfer structure is thicker than the first transfer structure, and the third transfer structure is thicker than the second transfer structure.

6. The display device of claim 5, wherein the first transfer structure comprises a first reflector,
   wherein the second transfer structure comprises a second reflector,
   wherein the third transfer structure comprises a third reflector,
   wherein the second reflector is thicker than the first reflector, and the third reflector is thicker than the second reflector.

7. The display device of claim 5, wherein the first transfer structure comprises a first solder layer,
   wherein the second transfer structure comprises a second solder layer,
   wherein the third transfer structure comprises a third solder layer,
   wherein the second solder layer is thicker than the first solder layer, and the third solder layer is thicker than the second solder layer.

* * * * *